(12) United States Patent
Kim

(10) Patent No.: US 9,767,061 B2
(45) Date of Patent: Sep. 19, 2017

(54) ELECTRONIC DEVICE

(71) Applicant: Samsung Electronics Co., Ltd., Gyeonggi-do (KR)

(72) Inventor: Seijin Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 401 days.

(21) Appl. No.: 14/518,035

(22) Filed: Oct. 20, 2014

(65) Prior Publication Data

US 2015/0113195 A1  Apr. 23, 2015

(30) Foreign Application Priority Data

Oct. 21, 2013 (KR) .................. 10-2013-0125629

(51) Int. Cl.
*G06F 17/50* (2006.01)
*G06F 13/40* (2006.01)

(52) U.S. Cl.
CPC ............. *G06F 13/4027* (2013.01); *H01L 2224/16145* (2013.01); *H01L 2224/16225* (2013.01); *H01L 2224/48227* (2013.01); *H01L 2224/73257* (2013.01); *H01L 2924/12044* (2013.01); *Y02B 60/1228* (2013.01); *Y02B 60/1235* (2013.01)

(58) Field of Classification Search
CPC . G06F 17/5068; G06F 13/4072; H01L 23/48; H01L 23/52
USPC .................. 716/100; 710/305; 257/734
See application file for complete search history.

(56) References Cited

U.S. PATENT DOCUMENTS

| | | | |
|---|---|---|---|
| 2007/0061614 A1* | 3/2007 | Choi .................. | G06F 12/0802 714/6.12 |
| 2008/0001271 A1* | 1/2008 | Marcinkiewicz ... | H01L 25/0657 257/678 |
| 2008/0116585 A1* | 5/2008 | Hsu ........................ | H01L 24/49 257/777 |
| 2009/0001557 A1* | 1/2009 | Renavikar ............... | H01L 21/50 257/712 |

(Continued)

FOREIGN PATENT DOCUMENTS

| | | |
|---|---|---|
| JP | 2010-141043 A | 6/2010 |
| KR | 10-2010-0081272 A | 7/2010 |
| KR | 10-2011-0033367 A | 3/2011 |

*Primary Examiner* — Christopher Shin
(74) *Attorney, Agent, or Firm* — Cha & Reiter, LLC

(57) ABSTRACT

An electronic device includes: a communication module; an input module; a display; an interface; at least one sensor; a memory; and a processor module. The processor module includes at least one of: at least one dummy chip including at least one Through Silicon Via (TSV); at least one memory bridge including at least one TSV; at least one memory connected to the at least one dummy chip and the at least one memory bridge and that can exchange an electric signal through the at least one dummy chip and the at least one memory bridge; or at least one processor. The at least one processor may be configured to exchange an electric signal through the at least one memory bridge, and to transmit an electric signal to at least one of the communication module, input module, display, interface, at least one sensor, or first memory. The at least one processor may exchange information via a circuit path that includes at least one of the memory bridge and a portion of the at least one memory, when transmitting the electric signal.

21 Claims, 10 Drawing Sheets

(56) References Cited

U.S. PATENT DOCUMENTS

| | | | |
|---|---|---|---|
| 2009/0052218 A1* | 2/2009 | Kang | G11C 5/02 365/51 |
| 2010/0174858 A1 | 7/2010 | Chen et al. | |
| 2012/0018885 A1* | 1/2012 | Lee | H01L 23/481 257/738 |
| 2012/0054422 A1* | 3/2012 | Gu | G11C 11/4076 711/105 |
| 2012/0161316 A1* | 6/2012 | Gonzalez | H01L 21/568 257/738 |
| 2013/0043584 A1* | 2/2013 | Kwon | H01L 23/49822 257/737 |
| 2013/0111123 A1* | 5/2013 | Thayer | G06F 13/16 711/105 |
| 2013/0208524 A1* | 8/2013 | Sung | G11O 5/04 365/63 |
| 2013/0256910 A1* | 10/2013 | Lee | H01L 21/76802 257/774 |
| 2013/0290914 A1* | 10/2013 | Chuang | G06F 17/5072 716/55 |
| 2014/0077391 A1* | 3/2014 | Kikuchi | H01L 24/97 257/774 |
| 2014/0284780 A1* | 9/2014 | Kinoshita | H01L 23/544 257/676 |
| 2014/0361428 A1* | 12/2014 | Park | H01L 23/49811 257/737 |
| 2015/0108657 A1* | 4/2015 | Kim | H01L 23/147 257/774 |
| 2015/0179285 A1* | 6/2015 | Kilmer | G11C 29/70 365/200 |
| 2016/0004633 A1* | 1/2016 | Hong | G11C 29/52 711/103 |

* cited by examiner

ELECTRONIC DEVICE

CLAIM OF PRIORITY

This application claims the benefit under 35 U.S.C. §119 (a) of a Korean patent application filed on Oct. 21, 2013 in the Korean Intellectual Property Office and assigned Serial No. 10-2013-0125629, the entire disclosure of which is hereby incorporated by reference.

BACKGROUND

Field

The present disclosure relates to an electronic device, and more particularly, to a semiconductor device with a vertical stack configuration and an electronic device including the same.

Description of the Related Art

In today's electronic devices such as smart phones, tablet Personal Computers (PC), mobile phones, laptop PCs, netbook computers, Personal Digital Assistants (PDA), Portable Multimedia Players (PMP), Moving Picture Experts Group layer-3 (MP3) player, camera, and wearable devices, it is desirable to minimize the internal space occupied by semiconductor chips.

It is beneficial for a portable electronic device to consume a small amount of power so as to exhibit a long battery life between recharges. A modern portable device includes a high performance processor and memory device so as to perform a function (e.g., game playing, moving picture reproduction) requiring high performance.

In order to achieve high performance operation with low consumption power, various interface methods and package methods between a memory device and a processor included in the electronic device have been proposed. For example, in a progression from conventional two-dimensional (2D) configurations in which a memory device and a processor are disposed in a common (horizontal) plane, an application package method of three-dimensional (3D) fabrication technology that stacks a memory device and a processor in the vertical dimension has been developed. In such 3D fabrication technology, a Through Silicon Via (TSV) method is used. The TSV method improves performance over other interconnect methods by reducing data bandwidth and transmission speed deterioration (previously a variable on package design).

Further, a so-called wide I/O interface has been developed, which is an Input/Output (I/O) interface with many parallel paths. A wide I/O interface can be used with a low cost memory device accessed with a multi-channel method, and enables high speed data transmission. One example of a wide I/O interface is a 512-bit parallel interface, which is significantly wider than common 16-bit or 32-bit parallel interfaces in wide use today.

Conventionally, when stacking and packaging a memory device and a processor having different interfaces, a plurality of TSVs are necessary. In such a TSV method, stacked semiconductor chips are directly penetrated and thus when separate space for penetrating is allocated in the layout, a design area of a semiconductor chip decreases. Moreover, when penetrating, the semiconductor chips may be damaged, which leads to a problem of increased process cost.

SUMMARY

Disclosed herein is a semiconductor device using a universal memory bridge chip that can electrically connect semiconductor chips using a TSV and that can provide a compatible interface to the semiconductor chips having different kinds of interfaces. An electronic device including the semiconductor device is further disclosed.

In accordance with an aspect of the present disclosure, an electronic device includes: a communication module; an input module; a display; an interface; at least one sensor; a first memory; and a processor module, wherein the processor module includes at least one of: at least one dummy chip including at least one Through Silicon Via (TSV); at least one memory bridge including at least one TSV; at least one second memory connected to the at least one dummy chip and the at least one memory bridge and configured to exchange an electric signal through the at least one dummy chip and the at least one memory bridge; or at least one processor configured to exchange an electric signal through the at least one memory bridge. The at least one processor may transmit an electric signal to at least one of the communication module, input module, display, interface, at least one sensor, or first memory and uses at least one of the memory bridge or the at least one memory, when transmitting the electric signal. For example, the at least one processor may exchange information via a circuit path that includes the at least one of the memory bridge and a portion of the at least one memory, when transmitting the electric signal.

In accordance with another aspect of the present disclosure, an electronic device includes: a bus; a processor module electrically connected to the bus; a memory electrically connected to the bus; an input and output (I/O) interface electrically connected to the bus; a display electrically connected to the bus; and a communication interface electrically connected to the bus, wherein the electronic device communicates with an external network using the communication interface, and wherein the processor module includes at least one of: at least one dummy chip including at least one Through Silicon Via (TSV); at least one memory bridge including at least one TSV; at least one second memory connected to the at least one dummy chip and the at least one memory bridge and that can exchange an electric signal through the at least one dummy chip and the at least one memory bridge; or at least one processor that can exchange an electric signal through the at least one memory bridge. The at least one processor transmits an electric signal to at least one of the first memory, the I/O interface, the display, or the communication interface.

In accordance with another aspect of the present disclosure, a method of operating such exemplary electronic device is disclosed. The method includes: transmitting, by the at least one processor within the processor module, an electric signal to at least one of the first memory, the I/O interface, the display, or the communication interface; and communicating, by the at least one processor, with an external network using the communication interface of the electronic device. Communicating with an external network using the communication interface of the electronic device may include using at least one of the dummy chip, the memory bridge, or the at least one memory using the at least one processor within the processor module.

BRIEF DESCRIPTION OF THE DRAWINGS

Aspects, features and advantages of the present disclosure will be more apparent from the following detailed description in conjunction with the accompanying drawings, in which.

DETAILED DESCRIPTION

Figure 1:
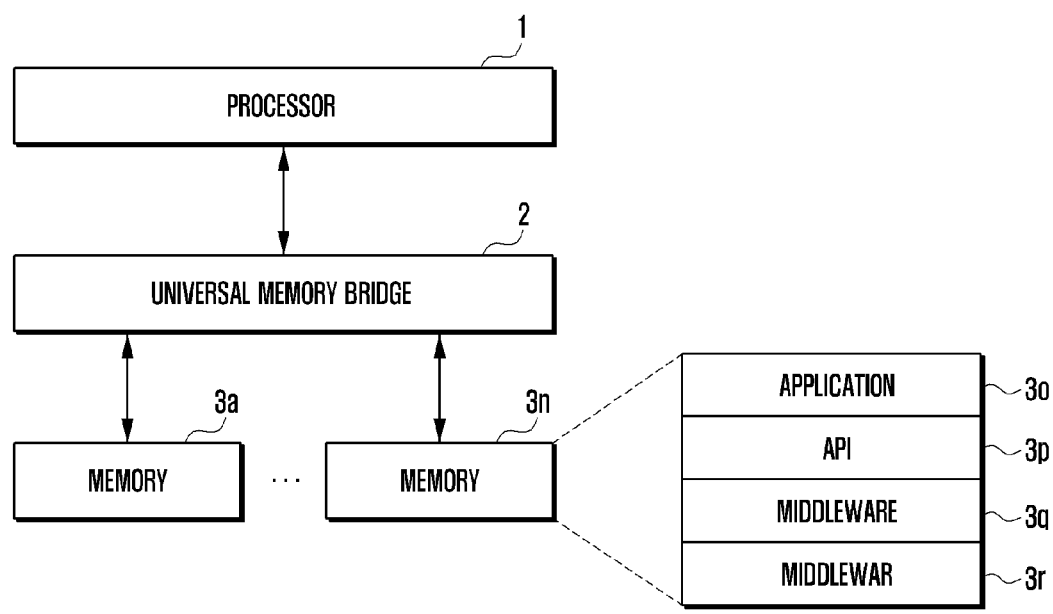
FIG. 1 is a block diagram illustrating a configuration of an electronic device including a semiconductor device according to an exemplary embodiment of the present disclosure.

Hereinafter, exemplary embodiments of the present disclosure are described in detail with reference to the accompanying drawings. While the present disclosure may be embodied in many different forms, specific embodiments of the present disclosure are shown in drawings and are described herein in detail, with the understanding that the present disclosure is to be considered as an exemplification of the principles of the invention and is not intended to limit the invention to the specific embodiments illustrated. The same or like reference numbers are used throughout the drawings to refer to the same or like parts.

The expression "comprising" or "may comprise" used in the present disclosure indicates presence of a corresponding function, operation, or element and does not exclude the addition of at least one other function, operation, or element. Further, in the present disclosure, the term "comprise" or "have" indicates presence of a characteristic, numeral, step, operation, element, component, or combination thereof described in this specification and does not exclude the presence or addition of at least one other characteristic, numeral, step, operation, element, component, or combination thereof.

In the present disclosure, an expression "or" includes any combination or the entire combination of together listed words. For example, "A or B" may include A, B, or A and B.

An expression of a first and a second in the present disclosure may represent various elements of the present disclosure, but does not limit corresponding elements. For example, the expression does not limit order and/or importance of corresponding elements. The expression may be used for distinguishing one element from another element. For example, both a first user device and a second user device are user devices and represent different user devices. For example, a first constituent element may be referred to as a second constituent element without deviating from the scope of the present disclosure, and similarly, a second constituent element may be referred to as a first constituent element.

When it is described that an element is "coupled" to another element, the element may be "directly coupled" to the other element or "electrically coupled" to the other element through a third element. However, when it is described that an element is "directly coupled" to another element, no element may exist between the element and the other element.

Terms used in the present disclosure are not to limit the present disclosure but to illustrate exemplary embodiments. When used in a description of the present disclosure and the appended claims, a singular form includes a plurality of forms unless it is represented differently explicitly Unless differently defined, entire terms including a technical term and a scientific term used here have the same meaning as a meaning that may be generally understood by a person of common skill in the art. It should be understood that generally using terms defined in a dictionary have a meaning corresponding to that of a context of related technology and are not analyzed as an ideal or excessively formal meaning unless explicitly defined.

Herein, when any chip (or element) is said to "exchange an electric signal" or the like, the chip may be either a source of a signal that is transmitted from the chip to another chip or to an external device, a recipient of a signal transmitted from another chip or an external device, or the chip may just provide a passive conductive path for a signal being transferred through the chip, or the chip may perform any combination of these functions.

FIG. 1 is a block diagram illustrating a configuration of an electronic device 5 including a semiconductor device according to an exemplary embodiment of the present disclosure.

The electronic device 5 may include a processor 1, a universal memory bridge 2, a memory 3, an input and output (I/O) interface (not shown), a display (not shown), and a communication interface (not shown). The processor 1, universal memory bridge 2, and memory 3 are packaged in a semiconductor device to be included in the electronic device. The memory 3 may be comprised of plural memories 3a-3n (where n refers to any integer greater than one), where each memory 3a-3n may be formed as a separate memory chip. Alternatively, memory 3 may be a single memory composed of a single memory chip.

Figure 7:
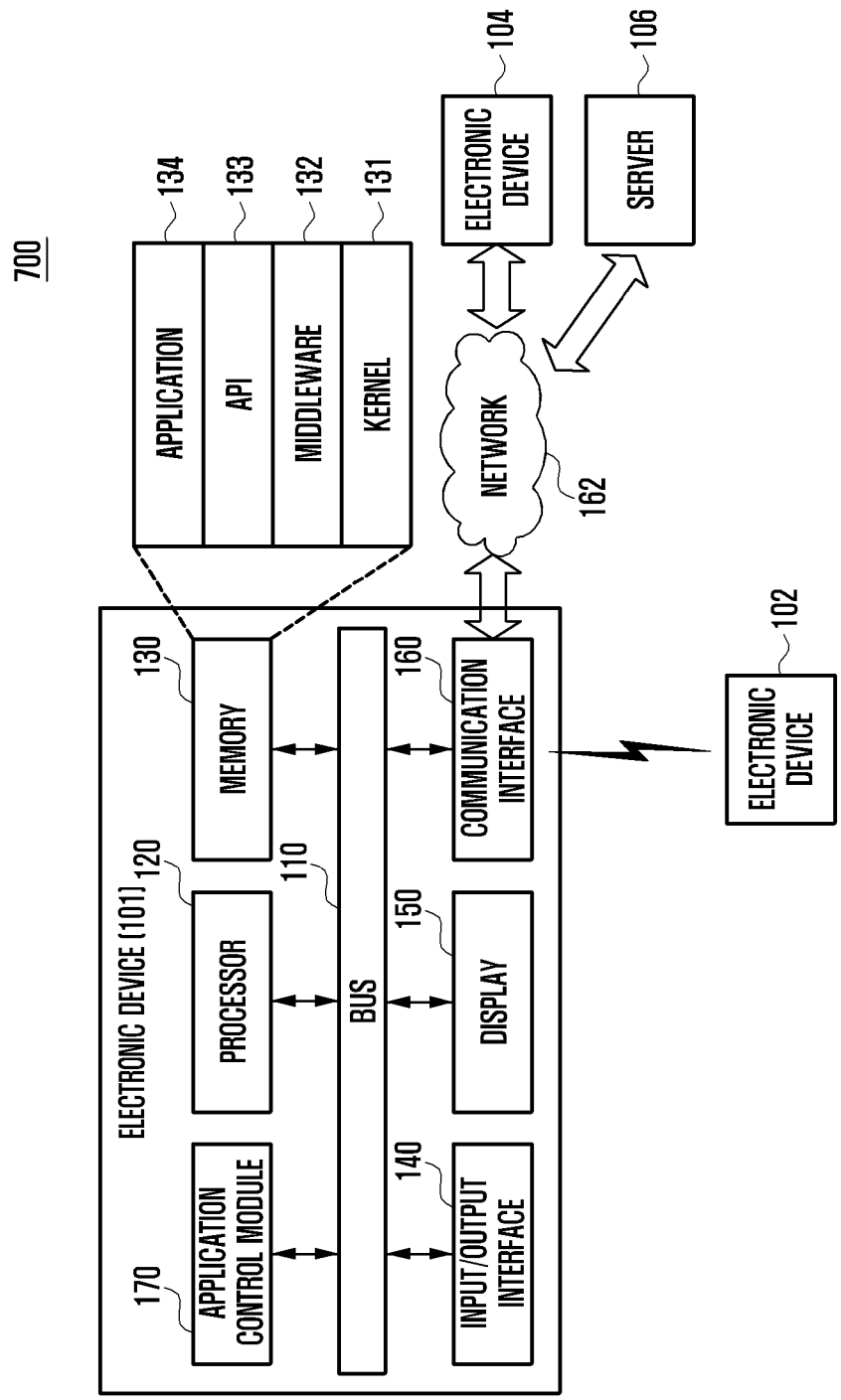
FIG. 7 is a block diagram illustrating a configuration of an electronic device according to an exemplary embodiment of the present disclosure.

The processor 1 may read information from memory 3 through the universal memory bridge 2 and/or may write information to memory 3. Processor 1 may receive an instruction from other constituent elements (e.g., memory 3, the I/O interface, the display, and the communication interface), decode the received instruction, and execute operation and data processing according to the decoded instruction. (Examples of these components are shown in FIG. 7 discussed later.)

The memory 3 may store an instruction or data received from (or generated by) the processor 1 or other constituent elements (e.g., the I/O interface, display, and communication interface). Memory 3 may include, for example, a programming module such as a kernel 3r, middleware 3q, an Application Programming Interface (API) 3p, and/or an application 3o. The foregoing respective programming modules may be formed with software, firmware, hardware, or a combination of at least two thereof.

The kernel 3r may control or manage a system resource (e.g., processor 1 or memory 3) used for executing operation or a function implemented in the remaining programming modules, for example, the middleware 3q, the API 3p, or the application 3o. Further, the kernel 3r may provide an interface that can control or manage an individual constituent element of the electronic device in conjunction with the middleware 3q, API 3p, or application 3o.

The middleware 3q may perform an intermediary function of enabling the API 3p or the application 3o to send and receive data by communicating with the kernel 3r. Further, the middleware 3q may control (e.g., schedule or load balance) a work request received from the application 3o using, for example, a method of aligning a priority that may use a system resource (e.g., the processor or the at least one memory 3a-3n) of the electronic device to at least one of the applications 3o.

The API 3p is an interface that enables the application 3o to control a function in which the kernel 3r or the middleware 3q provides and may include, for example, at least one interface or function (e.g., instruction) for file control, window control, image processing, or text control.

In an exemplary embodiment, the application 3o may include a Short Message Service (SMS)/Multimedia Message Service (MMS) application, e-mail application, calendar application, alarm application, health care application (e.g., application that measures an exercise amount or blood sugar), or environment information application (e.g., application that provides atmospheric pressure, humidity, or temperature information). Additionally or alternatively, the application 3o may be an application related to information exchange between the electronic device and an external electronic device. The application related to information exchange may include, for example, a notification relay application that transmits specific information to an external electronic device or a device management application that manages an external electronic device.

For example, the notification relay application may include a function of transmitting notification information that has occurred in other applications (e.g., an SMS/MMS application, e-mail application, health care application, or environment information application) of the electronic device to an external electronic device. Additionally or alternatively, for example, the notification relay application may receive notification information from an external electronic device and provide the notification information to a user. For example, the device management application may manage (e.g., install, delete, or update) turn-on/turn-off of a function (e.g., an external electronic device (or a partial component)) of at least a portion of an external electronic device that communicates with an electronic device or brightness of a display (or resolution adjustment), an application operating in an external electronic device, or a service (e.g., a communication service or a message service) provided in an external electronic device.

In an exemplary embodiment, the application 3o may include an application designated according to an attribute (e.g., a type) of an external electronic device. For example, when the external electronic device is an MP3 player, the application 3o may include an application related to music reproduction. Similarly, when the external electronic device is a mobile medical device, the application 3o may include an application related to health care. In an exemplary embodiment, the application 3o may include at least one of an application designated for the electronic device 5 or an application received from an external electronic device.

The I/O interface (e.g. 140 in FIG. 7) may transfer an instruction or data input by a user through an input and output device (e.g., a sensor, keyboard, or touch screen) to the processor 1, the at least one memory 3a-3n, and the communication interface. For example, the I/O interface may provide data about a user touch input through a touch screen to the processor 1.

The display (e.g. 150 in FIG. 7) may display various information (e.g., multimedia data or text data) to the user.

The communication interface (e.g. 160 in FIG. 7) may connect communication signals between the electronic device 5 and the external device. For example, the communication interface may support network communication (e.g., Internet, a Local Area Network (LAN), a Wide Area Network (WAN), a telecommunication network, a cellular network, a satellite network, or a Plain Old Telephone Service (POTS)), short range communication (e.g., Wireless Fidelity (WiFi), Bluetooth (BT), or Near Field Communication (NFC)), or wire communication (e.g., Universal Serial Bus (USB), High Definition Multimedia Interface (HDMI), Recommended Standard 232 (RS-232), or POTS). In an exemplary embodiment, a protocol for communication between the electronic device 5 and the external device (e.g., a short range communication protocol, network communication protocol, or wire communication protocol) may be supported in at least one of the API 3p or the middleware 3q.

The processor 1 may be an application processor and may exchange information with the memory 3 through the universal memory bridge 2 using a memory I/O interface.

The memory 3 may include at least one of an internal memory and an external memory. Memory 3 may exchange information with the processor 1 through the universal memory bridge 2 using a wide I/O interface.

The internal memory may include, for example, at least one of a volatile memory (e.g., a Dynamic RAM (DRAM), Static RAM (SRAM), or Synchronous Dynamic RAM (SDRAM)), non-volatile memory (e.g., a One Time Programmable ROM (OTPROM), Programmable ROM (PROM), Erasable and Programmable ROM (EPROM), Electrically Erasable and Programmable ROM (EEPROM), Mask ROM, or Flash ROM), hard disk drive (HDD), or solid state drive (SSD).

The external memory may include at least one of a Compact Flash (CF), Secure Digital (SD), Micro Secure Digital (Micro-SD), Mini Secure Digital (Mini-SD), extreme Digital (xD), and memory Stick.

The universal memory bridge 2 may electrically connect the processor 1 and the memory 3 and provide an interface in which the processor 1 and memory 3 having different input and output interfaces can exchange information.

The universal memory bridge 2 may perform a memory controller function of performing or controlling Error Checking and Correction (ECC), refresh, and test operations of memory 3. Universal memory bridge 2 is termed "universal" because it may interface with different types of memory chips and/or different memory chip sizes.

Figure 2:
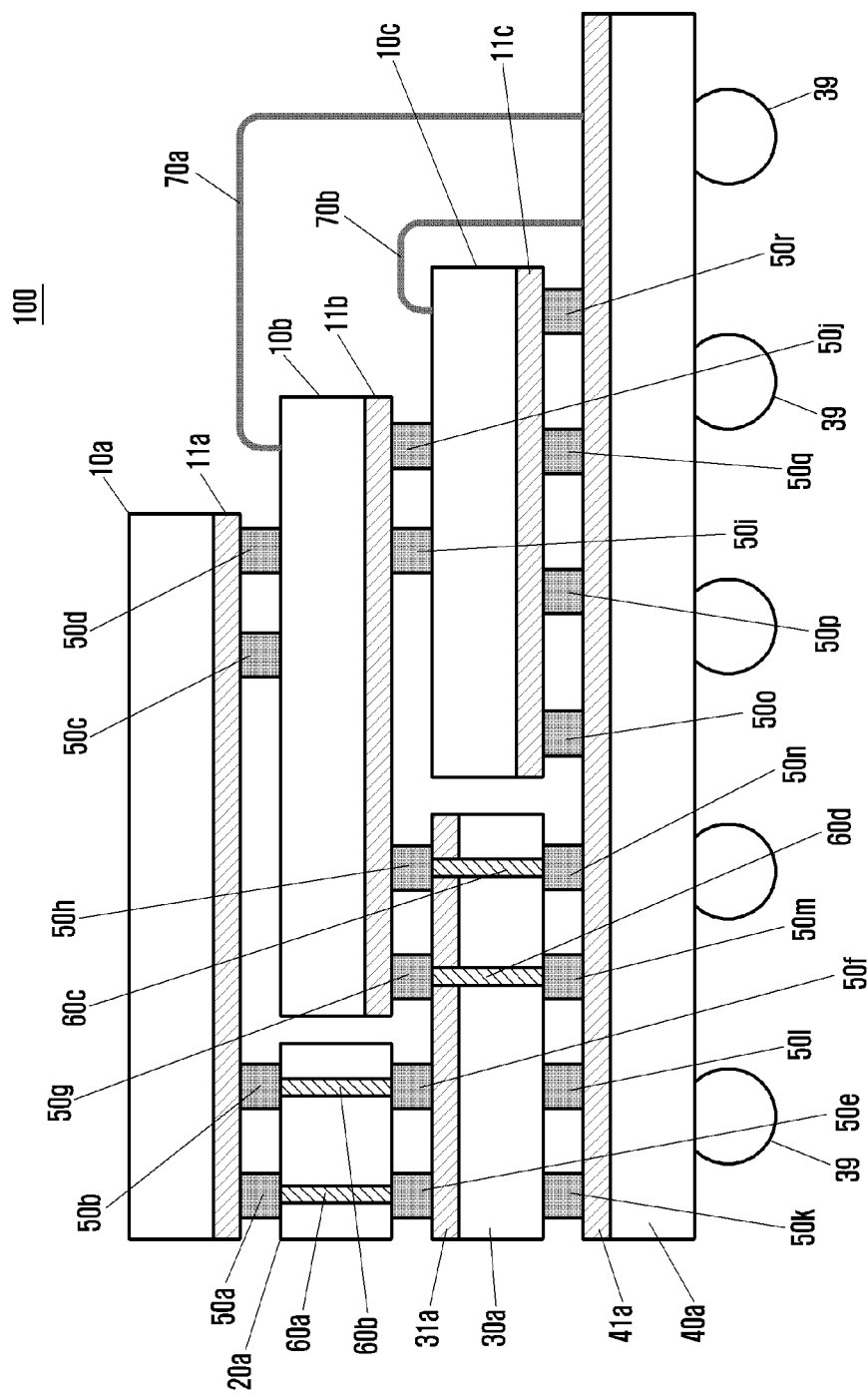
FIG. 2 is a cross-sectional view illustrating a semiconductor device according to an exemplary embodiment of the present disclosure.

FIG. 2 is a cross-sectional view illustrating a semiconductor device, designated as 100, according to an exemplary embodiment of the present disclosure. Semiconductor device 100 may operate as a processor module in some embodiments, and in these cases, it may be called a processor module.

The semiconductor device 100 may include a plurality of semiconductor chips 10a, 10b, 20a, and 30a that may each exchange an electric signal. Semiconductor device 100 may include one or more memory chips 10a and 10b that each exchange an electric signal, a processor 10c, a dummy chip 20a, and a universal memory bridge 30a. Memory chips 10a and 10b, processor 10c, dummy chip 20a, and universal memory bridge 30a may exchange an electric signal over a partial region and may be connected on a board 40a. According to an exemplary embodiment, the semiconductor device is connected to the universal memory bridge 30a to be connected to an external device (e.g., an external memory device). Further, semiconductor device 100 is illustrated as comprising a vertical stack (commonly referred to a "Z" direction stack) of chips so as to provide a 3D fabrication structure, e.g., a 3D package or 3D integrated circuit (IC).

In the example of FIG. 2 and other figures described below, various chips such as 10a, 10b, 10c are exemplified as memory chips or processor chips. However, other types of chips may be utilized in the semiconductor devices, additionally or alternatively to those described.

The dummy chip 20a is a semiconductor chip that is devoid of active components such as transistors, and that exchanges an electric signal between the stacked memory chips 10a and 10b, processor 10c, dummy chip 20a, and universal memory bridge 30a. Any dummy chip as described herein may be a semiconductor chip that only performs a passive connection function. The dummy chip 20a may include at least one TSV. Memory chips 10a and 10b, processor 10c, dummy chip 20a, and universal memory bridge 30a may exchange an electric signal via at least one conductive bump 50a-50r formed at one surface of the respective component(s).

Herein, when a conductive bump is said to be formed or disposed "at one surface" or "at a surface", the conductive bump may be a finally formed bump between a first surface of a first chip and an adjacent surface of a second chip. For instance, a single conductive bump 50d is shown to exist between the lower surface of chip 10a and the upper surface of chip 10b; this conductive bump may be said to be formed at one surface of either chip 10a or chip 10b. Prior to a fusing fabrication process step, any conductive bump may comprise a first portion on the first surface of the first chip and a second portion on the adjacent surface of the second chip, which are then fused under a high temperature process to form the final bump such as 50d.

Power sources may be separately connected to memory chips 10a and 10b using power source lines 70a and 70b, respectively. With the top end of power line 70a landing at a point laterally displaced from the conductive bumps at the bottom surface of chip 10a, metallization (not shown) on or near the top surface of chip 10b may connect power line 70a to a bump such as 50d to provide power to chip 10a. Likewise, metallization on or near the top surface of chip 10c may be used to connect power line 70b to a bump such as 50j at the bottom surface of chip 10b to provide power to chip 10b. Thus, power sources may be separately connected to memory chips 10a and 10b using the power source lines 70a and 70b, respectively, and in order to exchange an electric signal using the conductive bumps 50a, 50b, 50c, 50d, 50g, 50h, 50i, and 50j formed at a surface, circuit surfaces 11a and 11b may be formed to face downward (e.g., a direction towards the board 40a stacked in a lowermost layer). The power source lines 70a and 70b may be used for supplying power and may be used as an electric signal line. The conductive bumps 50c and 50d may be used for supplying power via connection to the power source line 70a, as noted above. These bumps may also be used as part of an electric signal line, i.e., as part of an electric circuit. Memory chips 10a and 10b and the processor 10c may be disposed in a step form for a power source line. In other words, the top surface of chip 10b is shown to extend laterally from the right edge of chip 10a, and the top surface of chip 10c is shown to extend laterally from the right edge of chip 10b, thus forming a step-like structure to facilitate wire connection of the power lines 70a, 70b.

In order to exchange an electric signal using the conductive bumps 50o, 50p, 50q, and 50r formed at a surface, the processor 10c may be formed such that a circuit surface 11c faces downward (e.g., a direction towards the board 40a stacked in a lowermost layer).

In order to exchange an electric signal using the conductive bumps 50o, 50p, 50q, and 50r formed at a surface, the board 40a may be formed such that the lower circuit surface 11c is adjacent an upper metalized surface 41a of board 40a. The board 40a is a portion that becomes a base of the stacked chips 10a, 10b, 10c and the universal memory bridge 30a. Memory chips 10a and 10b, the processor 10c, the dummy chip 20a, and the universal memory bridge 30a may receive power through the board 40a or may be connected to an external device. The board 40a may be a printed circuit board (PCB) or may have various forms such as an interposer (intermediate circuit board, e.g., silicon interposer). A plurality of balls 39 are disposed on the bottom surface of board 40a, which may be part of a ball grid array, enabling individualized connections of designated circuit points to circuit points of an external device(s).

For example, the first memory 10a may receive separate power using the conductive bumps 50c and 50d that make contact with the second memory 10b and the first power source line 70a, which connects the second memory 10b and the board 40a. The second memory 10b may receive separate power using the conductive bumps 50i and 50j that contact with the processor 10c and the second power source line 70b, which connects the processor 10c and the board 40a.

In an exemplary embodiment, the first memory 10a may exchange an electric signal with the dummy chip 20a through at least one conductive bump 50a and 50b disposed at the bottom surface thereof. The second memory 10b may exchange an electric signal with the universal memory bridge 30a through at least one conductive bump 50g and 50h disposed at the bottom surface thereof.

When an electric signal is transmitted to at least one conductive bump 50a, 50b, 50c, and 50d disposed at the bottom surface of the first memory chip 10a, the dummy chip 20a may transmit an electric signal to at least one TSV 60a and 60b connected to the at least one conductive bump 50a and 50b.

The dummy chip 20a may transmit an electric signal received from the at least one TSV 60a and 60b therein to the universal memory bridge 30a through at least one conductive bump 50e and 50f disposed at the bottom surface thereof.

The universal memory bridge 30a may receive an electric signal through the at least one conductive bump 50e and 50f disposed at the top surface of the dummy chip 20a and the at least one conductive bump 50g and 50h disposed at the bottom surface of the second memory 10b. The universal memory bridge 30a may transmit an electric signal to at least one TSV 60c and 60d connected to the at least one conductive bump 50g and 50h. At least one TSV 60c and 60d included in the universal memory bridge 30a may not be directly connected to the at least one conductive bump 50g and 50h.

The universal memory bridge 30a may comprise an I/O interface that can interconvert the at least one memory 10a, 10b and the processor 10c having different input and output interfaces. The universal memory bridge may comprise an I/O interface that can interconvert an external memory device, connectable to board 40a, and the at least one memory 10a, 10b.

The universal memory bridge 30a may transmit information received from the first memory 10a and the second memory 10b to the board 40a through at least one conductive bump 50k, 50l, 50m, and 50n and receive information received from the processor 10c through at least one conductive bump 50k, 50l, 50m, and 50n connected to the board 40a.

In this case, the universal memory bridge 30a may be formed with a top circuit surface 31a (e.g., facing a direction towards the first memory 10a stacked in an uppermost layer). When the circuit surface 31a is formed to face upward, the universal memory bridge 30a may include the second memory 10b and the at least one TSV 60c and 60d that transmit information. In other words, a portion of the second memory 10b may act as a bridge from the processor 10c to the first memory 10a. Further, the metalized surfaces (circuit surfaces) 31a, 11b and 11a may each be patterned an orthogonal or skewed direction to a plane of the shown cross section, so as to connect desired connection points of memory 10b to desired connection points of memory 10a, through bridge 30a and dummy chip 20a. In this manner, processor 10c may be communicatively coupled in a circuit to memory 10a through memory 10b, bridge 30a and dummy chip 20a.

The universal memory bridge 30a performs a function of interconverting different kinds of memory interfaces at the circuit surface 31a. For example, the universal memory bridge 30a may transmit and receive data to a random memory interface (e.g., WIDE-IO interface) through the conductive bumps 50e and 50f connected to the dummy chip 20a, convert the data with different kinds of memory interfaces (e.g., LPDDR series), and transmit and receive data of a converted from to the board 40a through the TSVs 60c and 60d. In the above description of semiconductor device 100, connections at a single cross sectional location have been described. In implementations utilizing parallel data transfer mechanisms, the connections of FIG. 2 may occur repetitively in a direction orthogonal or skewed to the shown cross section. By way of example, in a WIDE-IO interface, parallel data connections to achieve upwards of 512-bit parallel data exchange may comprise a similar order of TSVs and bumps in the orthogonal direction.

Figure 3:
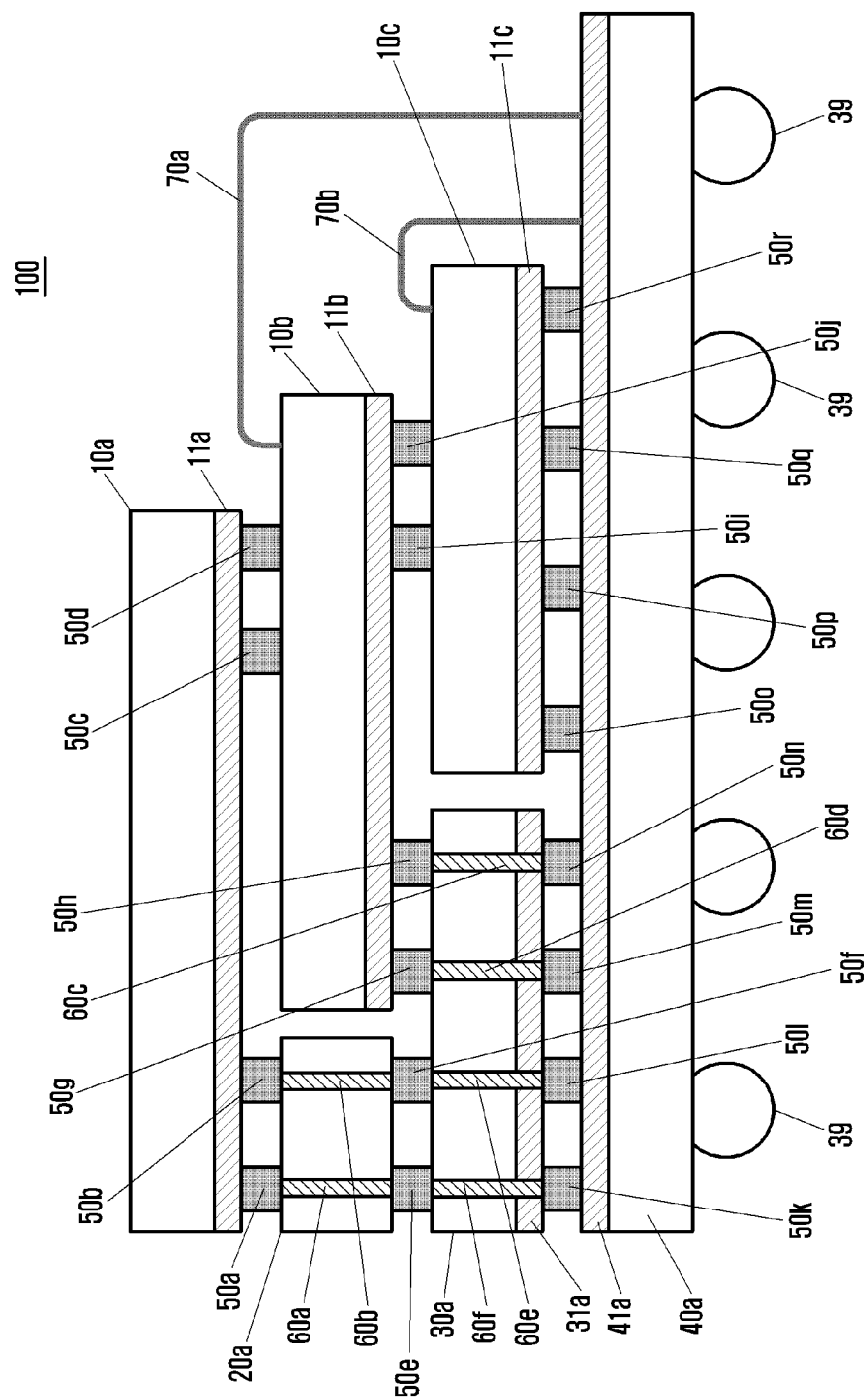
FIG. 3 is a cross-sectional view illustrating a semiconductor device according to another exemplary embodiment of the present disclosure.

FIG. 3 is a cross-sectional view illustrating a semiconductor device, 100', according to another exemplary embodiment of the present disclosure. Semiconductor device 100' may include a plurality of semiconductor chips 10a, 10b, 20a, and 30a that exchange an electric signal. One major difference between the above-described device 100 is the provision of additional TSVs 60e and 60f within memory bridge 30a, which are used to convey signals between the uppermost memory chip 10a and the board 40a.

The semiconductor device 100' may include one or more memory chips 10a and 10b, a processor 10c, a dummy chip 20a, and a universal memory bridge 30a that exchange an electric signal. Memory chips 10a and 10b, the processor 10c, the dummy chip 20a, and the universal memory bridge 30a may exchange an electric signal over a partial region and may be connected on a board 40a. According to an exemplary embodiment, various chips of semiconductor device 100' are connected to the universal memory bridge 30a which is connectable to an external device (e.g., an external memory device) through board 40a (where the external device may be connected to balls 39).

The dummy chip 20a is a semiconductor chip that exchanges an electric signal among the stacked memory chips 10a and 10b, the processor 10c, and the universal memory bridge 30a. The dummy chip 20a may include at least one TSV. Memory chips 10a and 10b, the processor 10c, the dummy chip 20a, and the universal memory bridge 30a may exchange an electric signal via at least one conductive bump 50a-50r formed at one surface.

Power sources may be separately connected to the memory chips 10a and 10b using power source lines 70a and 70b, respectively, as described above for device 100 of FIG. 3, thus redundant description thereof is omitted here. In order to exchange an electric signal using the conductive bumps 50o, 50p, 50q, and 50r formed at one surface, the processor 10c may be formed such that a circuit surface 11c faces downward (e.g., towards a direction of the board 40a stacked in a lowermost layer).

In order to exchange an electric signal using the conductive bumps 50o, 50p, 50q, and 50r formed at one surface, the board 40a may be formed such that the circuit surface 11c faces upward (e.g., a direction of the first memory 10a stacked in a uppermost layer). As described above for semiconductor device 100, board 40a is a portion that likewise becomes a base of the stacked chips of device 100', i.e., chips 10a, 10b, 10c, 20a and the universal memory bridge 30a. Memory chips 10a and 10b, the processor 10c, the dummy chip 20a, and the universal memory bridge 30a may receive power through the board 40a in the manner described above, or may be connected to an external device.

In an exemplary embodiment, the first memory 10a may exchange an electric signal with the dummy chip 20a through the at least one conductive bump 50a, 50b, 50c, and 50d disposed at one surface thereof. The second memory 10b may exchange an electric signal with the universal memory bridge 30a through the at least one conductive bump 50g, 50h, 50i, and 50j disposed at one surface thereof.

When an electric signal is transmitted to the at least one conductive bump 50a, 50b, 50c, and 50d disposed at one surface of the first memory chip 10a, the dummy chip 20a may transmit an electric signal to at least one TSV 60a and 60b connected to the at least one conductive bump 50a, 50b, 50c, and 50d.

The dummy chip 20a may transmit an electric signal received through the at least one conductive bump 50e and 50f disposed at one surface thereof to the universal memory bridge 30a.

The universal memory bridge 30a may receive an electric signal through the at least one conductive bump 50e and 50f disposed at one surface of the dummy chip 20a and the at least one conductive bump 50g and 50h disposed at one surface of the second memory 10b. The universal memory bridge 30a may transmit an electric signal to at least one TSV 60c, 60d, 60e, and 60f connected to at least one conductive bump 50g and 50h. As noted earlier, semiconductor device 100' differs from device 100 via the inclusion of TSVs 60e, 60f which may be used to transfer signals to and from board 40a and memory 10a, in electrical paths that include TSVs 60a, 60b, respectively, of dummy chip 20a. To this end, metallization 41a on the top surface of board 40a, may be patterned in the orthogonal or skewed direction of the shown cross-sectional view (e.g. in the direction into the paper) so as to enable individualized electrical connections between desired points of the board 40a and the memory chip 10a. Additional bumps may be included as necessary in the orthogonal direction to achieve the desired isolated electrical connections.

The universal memory bridge 30a may transmit information received from the first memory 10a and the second memory 10b to the board 40a through at least one conductive bump 50k, 50l, 50m, and 50n and receive information received from the processor 10c through at least one conductive bump 50k, 50l, 50m, and 50n connected to the board 40a.

In this case, the universal memory bridge 30a may be formed such that a circuit surface 31a faces downward (e.g., in a direction towards the board 40a stacked in a lowermost layer). When the circuit surface 31a faces downward, the universal memory bridge 30a may include the second memory 10b, the at least one TSV 60c and 60d and the dummy chip 20a that transmit information, and the at least one TSV 60e and 60f that transmit information.

Figure 4:
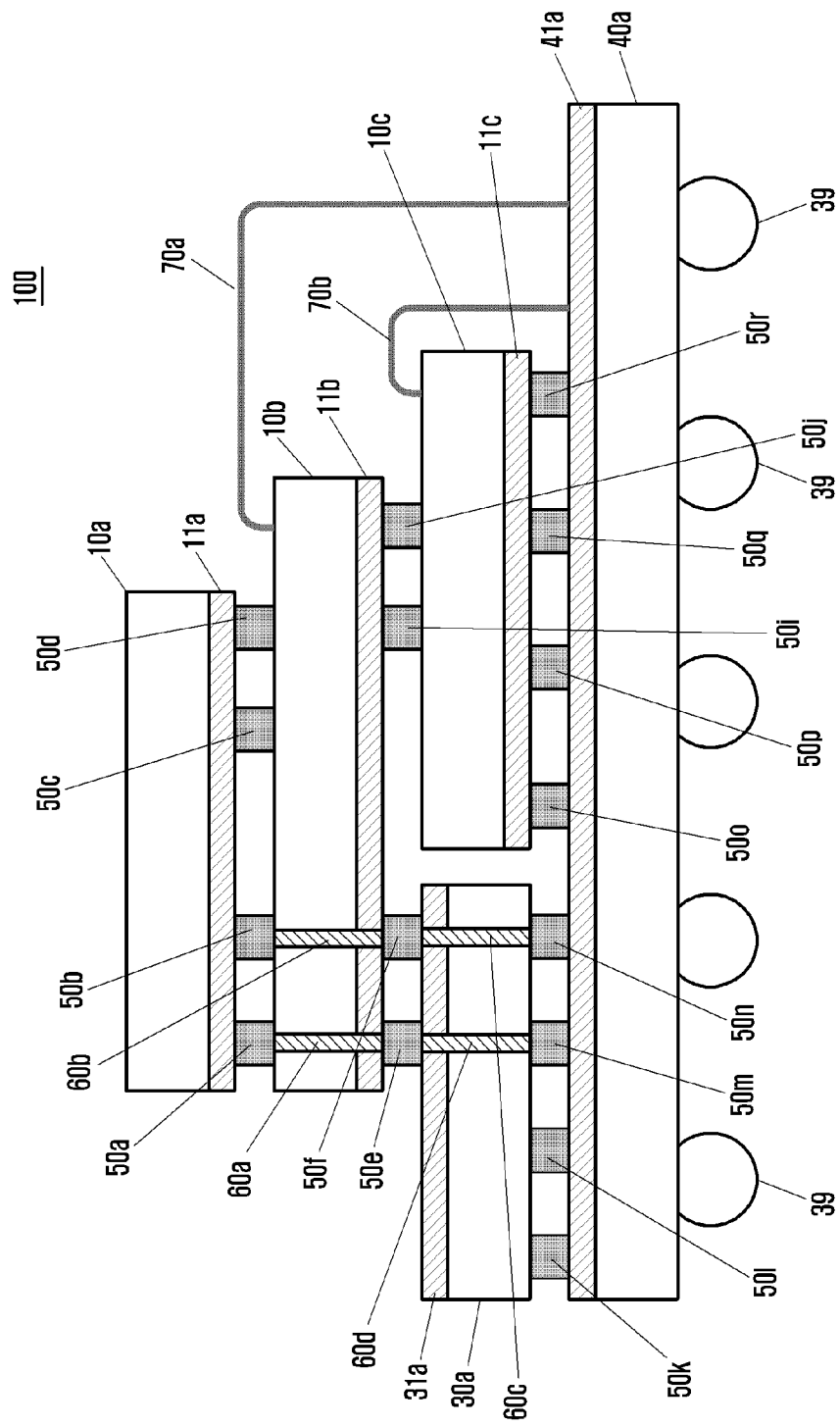
FIG. 4 is a cross-sectional view illustrating a semiconductor device according to another exemplary embodiment of the present disclosure.

FIG. 4 is a cross-sectional view illustrating a semiconductor device according to another exemplary embodiment of the present disclosure.

The semiconductor device, 100″, may include a plurality of semiconductor chips 10a, 10b, and 30a that exchange an electric signal. Semiconductor device may include one or more memory chips 10a and 10b that exchange an electric signal, processor 10c, and universal memory bridge 30a. Memory chips 10a and 10b, the processor 10c, and the universal memory bridge 30a may exchange an electric signal amongst one another over a partial region and may be connected on a board 40a. According to an exemplary embodiment, the universal memory bridge 30a is connectable to an external device (e.g., an external memory device), so as to electrically connect any of the other chips 10a, 10b, 10c to the external device.

Semiconductor device 100″ differs from device 100 of FIG. 2 by including TSVs 60a and 60b within memory chip 10b, and omitting dummy chip 20a. TSVs 60a, 60b each serve as a portion of a circuit path between a respective connection point of memory 10a and board 40a. For instance, TSV 60a is connected in series with TSV 60d within memory bridge 30a, to thereby connect a desired circuit point on memory 10a to a desired circuit point on board 40a.

Power sources may be separately connected to the at least one memory 10a and 10b using power source lines 70a and 70b, respectively, in the same manner described above for semiconductor device 100 of FIG. 2, thus redundant description thereof is omitted. In order to exchange an electric signal using conductive bumps 50l, 50m, 50n, and 50o formed at one surface, the processor 10c may be formed such that a circuit surface 11c faces downward (e.g., a direction of the board 40a stacked in a lowermost layer).

In order to exchange an electric signal using conductive bumps 50m, 50n, 50o, and 50p formed at one surface, the board 40a may be formed such that the circuit surface 11c faces upward (e.g., a direction of the first memory 10a stacked in a uppermost layer). The board 40a is a portion that becomes a base of the stacked at least one memory 10a and 10b, the processor 10c, and the universal memory bridge 30a, and the at least one memory 10a and 10b, the processor 10c, and the universal memory bridge 30a may receive power through the board or may be connected to an external device.

For example, the first memory 10a may receive separate power using the conductive bumps 50c and 50d that contact with the second memory 10b and the first power source line 70a that connects the second memory 10b and the board 40a. The second memory 10b may receive separate power using conductive bumps 50g and 50h that contact with the processor 10c and the second power source line 70b that connects the processor 10c and the board 40a. The at least one memory 10a and 10b and the processor 10c may be disposed in a step form for a power source line.

In an exemplary embodiment, the first memory 10a may exchange an electric signal with the universal memory bridge 30a through at least one conductive bump 50a, 50b, 50c, and 50d disposed at one surface thereof. The second memory 10b may exchange an electric signal with the universal memory bridge 30a through at least one conductive bump 50e, 50f, 50g, and 50h disposed at one surface thereof.

When an electric signal is transmitted to at least one conductive bump 50a, 50b, 50c, and 50d disposed at one surface of the first memory chip 10a, the second memory 10b may transmit an electric signal to at least one TSV 60a and 60b connected to at least one conductive bump 50e, 50f, 50g, and 50h.

The universal memory bridge 30a may transmit an electric signal received through at least one conductive bump 50i, 50j, 50k and 50l disposed at one surface thereof. The universal memory bridge 30a may transmit an electric signal to the at least one TSV 60c and 60d connected to at least one conductive bump 50i, 50j, 50k and 50l.

The universal memory bridge 30a may transmit information received from the first memory 10a and the second memory 10b to the board 40a through at least one conductive bump 50i, 50j, 50k, and 50l and receive information received from the processor 10c through the at least one conductive bump 50i, 50j, 50k, and 50l connected to the board 40a. Metallization 41a of board 40a, and metallization 11c of processor chip 10c, are each patterned in the direction orthogonal to the cross sectional view shown, so as to isolate circuit points for individualized connection to other points. Thereby, designated circuit points of processor chip 10c are connectable to respective circuit points of memory 10a through circuit paths that include TSVs such as 60c, 60d within memory bridge 30a and 60a, 60b within the second memory 10b. Accordingly, a memory bridge between first memory 10a and board 40a/processor 10c can be considered to include both the universal memory bridge 30a and a portion of the second memory 10b for transmitting information therebetween.

Figure 5A:
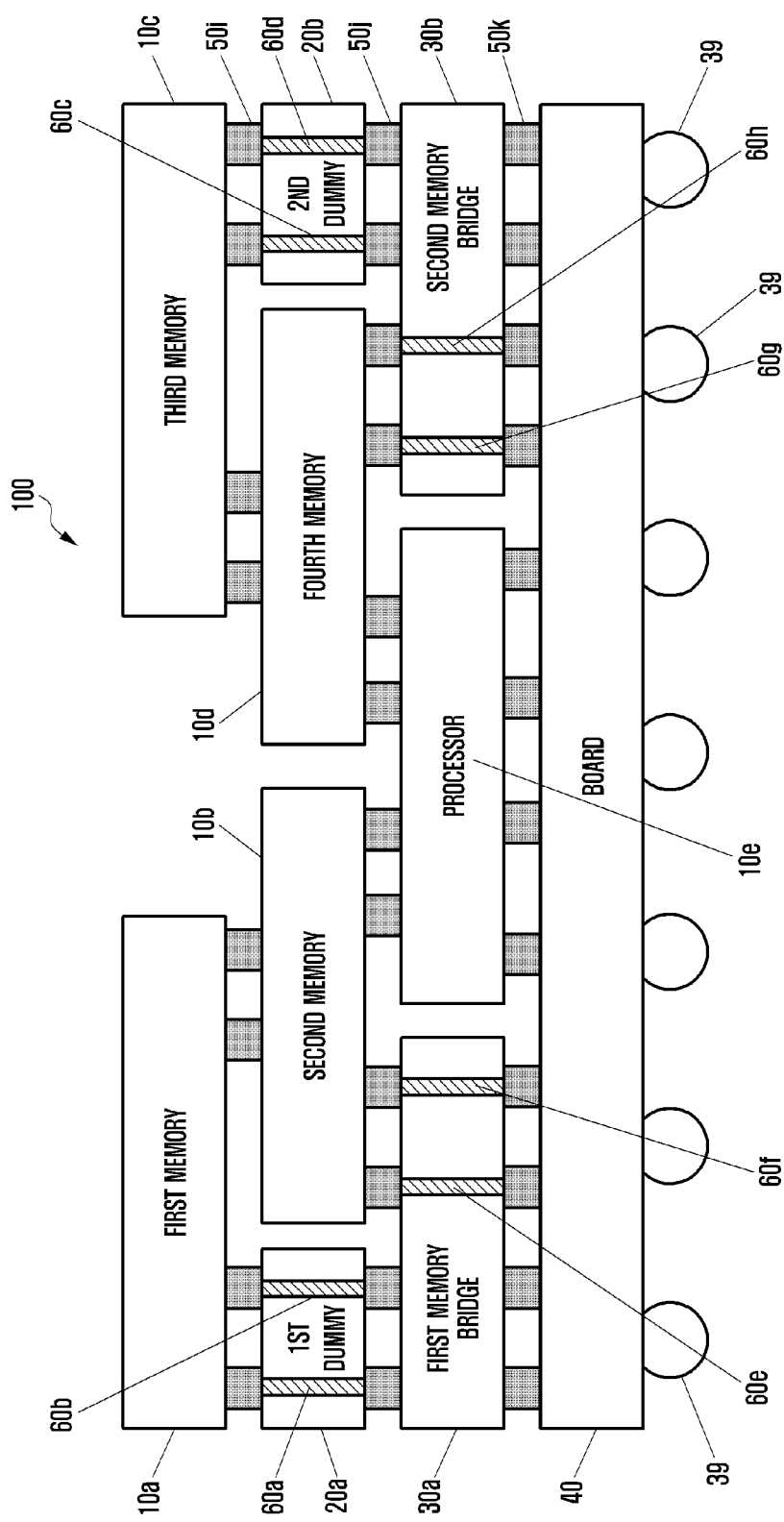
FIG. 5A is a cross-sectional view illustrating a semiconductor device according to another exemplary embodiment of the present disclosure.

FIG. 5A is a cross-sectional view illustrating a semiconductor device according to another exemplary embodiment of the present disclosure.

In FIG. 5A, the semiconductor device 100‴ may include a plurality of semiconductor chips 10a, 10b, 10c, 10d, 10e, 20a, 20b, 30a, and 30b that each exchange an electric signal. The semiconductor device 100‴ may include one or more memory chips 10a, 10b, 10c, and 10d that exchange an electric signal, a processor 10e, at least one dummy chip, exemplified as first dummy chip 20a and second dummy chip 20b, and at least one universal memory bridge, exemplified as first memory bridge 30a and second memory bridge 30b. Memory chips 10a, 10b, 10c, and 10d, the processor 10e, dummy chips 20a and 20b, and universal memory bridges 30a and 30b may each exchange an electric signal over a respective partial region and may be connected on a board 40a (e.g. a PCB). According to an exemplary embodiment, the first and second universal memory bridges 30a and 30b are connectable to an external device (e.g., an external memory device). The board 40 is a base in which memory chips 10a, 10b, 10c, and 10d, the processor 10e, the dummy chips 20a and 20b, and memory bridges 30a and 30b are stacked, and memories 10a, 10b, 10c, and 10d, the processor 10e, the at least one dummy chip 20a and 20b, and memory bridges 30a and 30b may receive power through the board 40 or may be connected to the exterior.

Dummy chips 20a and 20b are each a semiconductor chip that exchanges an electric signal between the stacked memories 10a, 10b, 10c, and 10d, the processor 10e, and the memory bridges 30a and 30b. Dummy chips 20a and 20b may include at least one TSV, exemplified as TSVs 60a, 60b, 60c, and 60d. Memory bridges 30a and 30b may include at least one TSV 60e, 60f, 60g, and 60h. Memories 10a, 10b, 10c, and 10d, the processor 10e, dummy chips 20a and 20b, and memory bridges 30a and 30b may each exchange an electric signal via at least one conductive bump formed at one surface thereof.

Dummy chips 20a and 20b are disposed at respective left and right sides of device 100" in the horizontal plane, as are memory bridges 30a and 30b. Processor 10e is centrally disposed, while memory chips 10a, 10b, 10c, and 10d are disposed and stacked at both sides of the right side and the left side about the processor 10e stacked on the board 40. First and second memory bridges 30a, 30b are disposed at the same vertical level in the stack as processor 10e; chips 20a, 10b, 10d and 20b are at the next highest vertical level; and the first and second memory chips 10a, 10c are at the highest vertical level in the stack in this example.

Universal memory bridges 30a and 30b are disposed at both sides of the right side and the left side about the processor 10e on the board 40. Dummy chips 20a and 20b are disposed at both sides of the right side and the left side about the second and fourth memories 10b, 10d which are each partially stacked on the processor 10e and partially stacked on one of memory bridges 30a and 30b. Memories 10a, 10c are disposed at both sides of the right side and the left side of memories 10b and 10d and are each partially stacked on dummy chips 20a and 20b, respectively.

Accordingly, device 100''' of FIG. 5A differs from the embodiments of FIGS. 2-4 by providing additional memories (third and fourth memories 10c, 10d), an additional dummy chip 20b, and an additional memory bridge 30b. Thereby, processor 10e and/or an external device(s) connectable to bumps 39 of board 40 may exchange signals with the memories 10a to 10d through circuit paths that include TSVs and conductive bumps such as 50i, 50j, 50k, etc. Note that each of the illustrated chips may include metallization (not shown) at top and/or bottom outer surfaces thereof which are patterned as described earlier to enable individualized connections to designated circuit points through the conductive bumps 50.

Figure 5B:
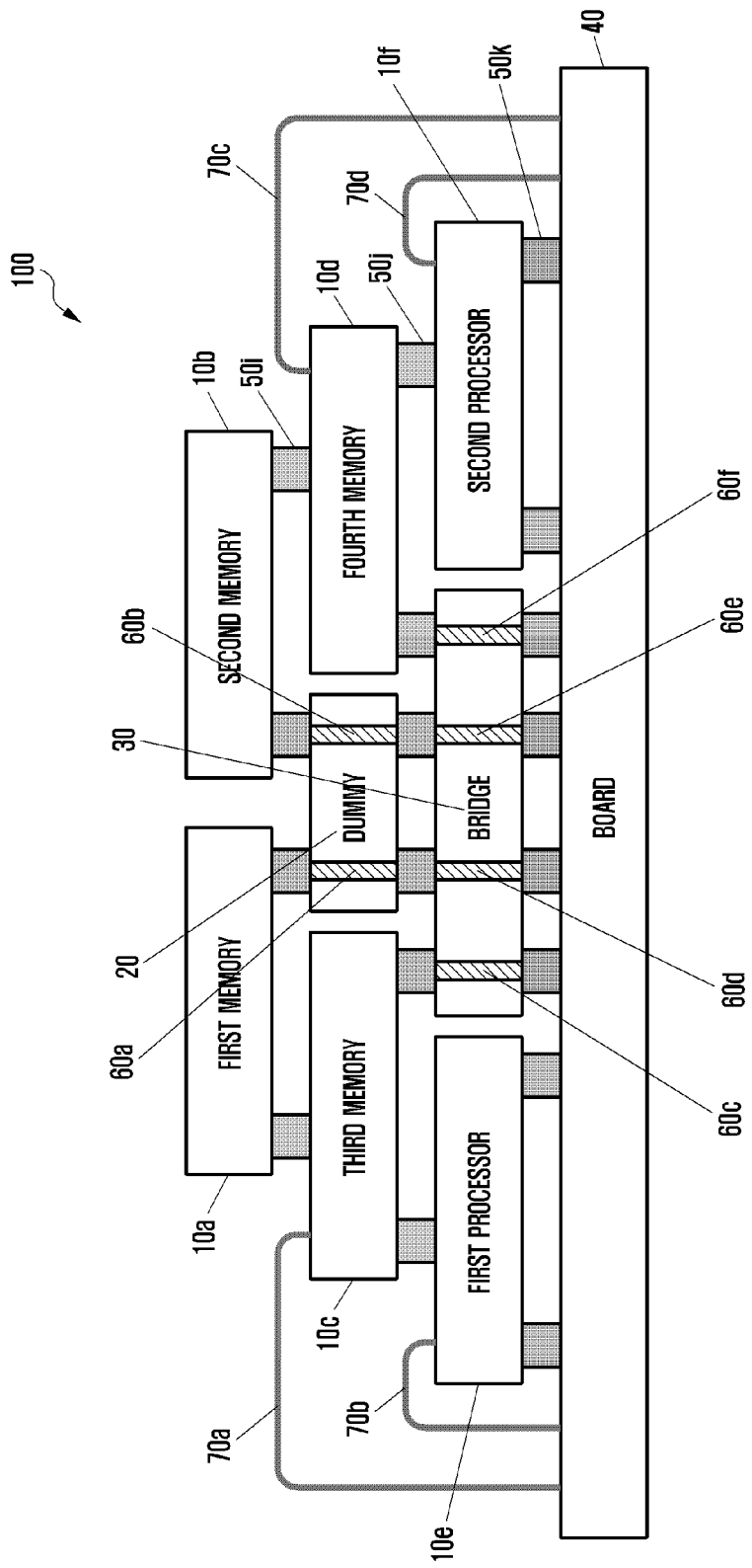
FIG. 5B is a cross-sectional view of a semiconductor device according to yet another embodiment of the present disclosure.

FIG. 5B is a cross-sectional view of a semiconductor device according to yet another embodiment of the present disclosure. Semiconductor device 100$^{iv}$ may include a plurality of semiconductor chips 10a, 10b, 10c, 10d, 10e, 10f, 20, and 30 that each exchange an electric signal. The semiconductor device 100$^{iv}$ may include one or more memory chips, exemplified as first memory 10a, second memory 10b, third memory 10c, and fourth memory 10d, that exchange an electric signal, one or more processors, exemplified as first processor 10e and second processor 10f, a dummy chip 20, and a universal memory bridge 30. Memory chips 10a, 10b, 10c, and 10d, processors 10e and 10f, the dummy chip 20, and the universal memory bridge 30 may exchange an electric signal over a partial region and may be connected on a board 40. According to an exemplary embodiment, various chips of the semiconductor device 100$^{iv}$ are connected to the universal memory bridge 30 to be connected to an external device (e.g., an external memory device). The board 40 is a base in which memories 10a, 10b, 10c, and 10d, processors 10e and 10f, the dummy chip 20, and the universal memory bridge 30 are stacked, and memories 10a, 10b, 10c, and 10d, processors 10e and 10f, the dummy chip 20, and the universal memory bridge 30 may receive power through the board 40 and/or may be connected to external devices through balls (such as 39, not shown in FIG. 5B) or the like on a surface thereof The dummy chip 20 is a semiconductor chip that exchanges an electric signal between the stacked at least one memory 10a, 10b, 10c, and 10d, the at least one processor 10e and 10f, and the universal memory bridge 30. The dummy chip 20 may include at least one TSV 60a and 60b. The at least one memory 10a, 10b, 10c, and 10d, the at least one processor 10e and 10f, the dummy chip 20, and the universal memory bridge 30 may exchange an electric signal via at least one conductive bump formed at one surface. The universal memory bridge 30 may include at least one TSV 60c, 60d, 60e, and 60f.

Further, one or more power source lines 70a, 70b, 70c, and 70d may be used as an electric signal line and may be used for supplying power. A conductive bump such as 50i may be used as part of an electric signal line and may be used for supplying power via connection to an adjacent power source line as 70c through metallization on or near a surface of the chip to which they are shown connected, as described earlier.

First processor 10e is disposed on the left hand side of the stacked structure, and second processor 10f is disposed on the right hand side, about the universal memory bridge 30 which is centrally disposed, at a first layer of a vertical stack on the board 40. Third and fourth memories 10c and 10d are disposed at both sides of the right side and the left side about the dummy chip 20 at a second layer on the at least one processor 10e and 10f and the universal memory bridge 30. First and second memories 10a, 10b, are disposed on third and fourth memories 10c, and 10d and the dummy chip 20 in a highest layer of the vertical stack.

Any of the semiconductor devices 100, 100', 100", 100''' and 100$^{iv}$ may function at least in part as a processor module in some embodiments, and in these cases, may be called a processor module.

Figure 6:
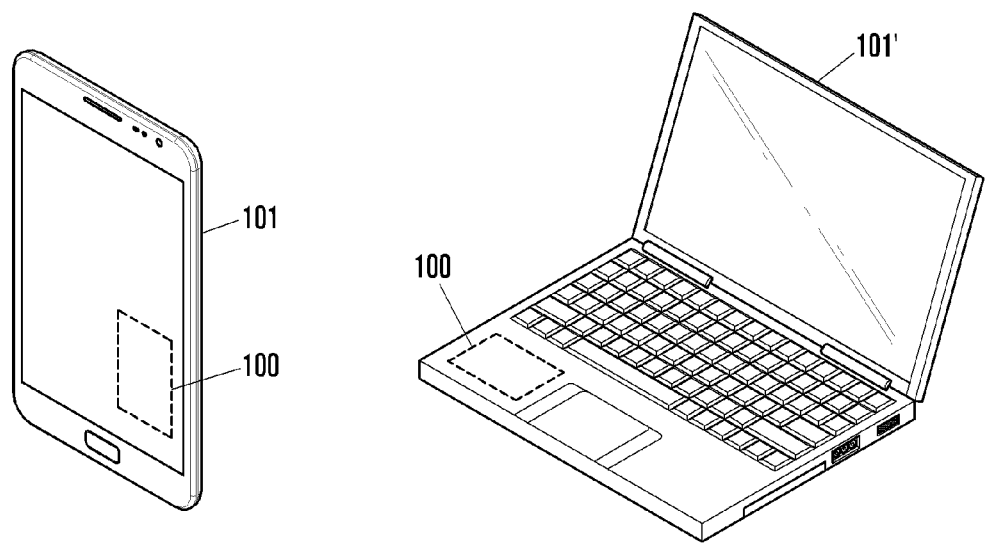
FIG. 6 depicts perspective views of various examples of an electronic device including a semiconductor device according to an exemplary embodiment of the present disclosure.
Figure 6:
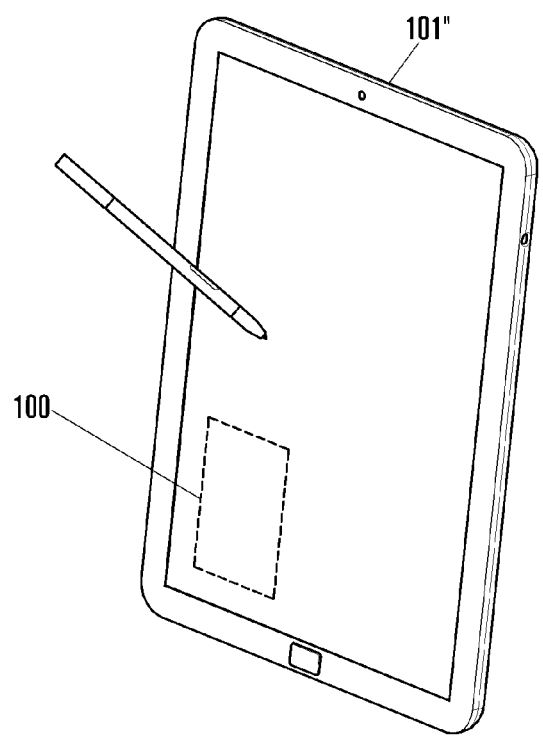

FIG. 6 depicts perspective views of various examples of an electronic device including a semiconductor device 100 according to an exemplary embodiment of the present disclosure. Examples of semiconductor device 100 in FIG. 6 include device 100, 100', 100", 100''' and 100$^{iv}$ described earlier.

The electronic device according to an exemplary embodiment of the present disclosure may be a device including a communication function. For example, the electronic device may be a smart phone, tablet Personal Computer (PC), mobile phone, video phone, e-book reader, desktop PC, laptop PC, Netbook computer, Personal Digital Assistant (PDA), Portable Multimedia Player (PMP), MP3 player, mobile medical equipment, camera, or wearable device (e.g., Head-Mounted-Device (HMD) such as electronic glasses), electronic clothing, electronic bracelet, electronic necklace, electronic accessory, electronic tattoo, or smart watch. In FIG. 6, a smart phone 101, laptop 101' and tablet 101" and depicted as examples of the electronic device.

According to various exemplary embodiments, the electronic device may be a smart home appliance having a communication function. The smart home appliance, for example, may be a television, Digital Video Disk (DVD) player, audio device, refrigerator, air conditioner, vacuum cleaner, oven, microwave oven, washing machine, air cleaner, set-top box, television box (e.g., Samsung Home- Sync™, AppleTV™, or Google TV™), game consoles, electronic dictionary, electronic key, camcorder, or electronic frame.

According to various exemplary embodiments, the electronic device may be any of various medical equipments (e.g., a Magnetic Resonance Angiography (MRA) device, Magnetic Resonance Imaging (MRI) device, Computed Tomography (CT) device, scanning device, and ultrasonic wave device), a navigation device, a Global Positioning System (GPS) receiver, an Event Data Recorder (EDR), a Flight Data Recorder (FDR), a vehicle infotainment device, an electronic equipment for ship (e.g., navigation device for ship and gyro compass), avionics, a security device, or an industrial or home robot.

According to various exemplary embodiments, the electronic device may be a portion of furniture or building/construction, an electronic board, an electronic signature receiving device, a projector, or various measuring devices (e.g., water supply, electricity, gas, or electric wave measuring device) including a communication function. An electronic device according to the present disclosure may be at least one combination of the foregoing various devices. Further, an electronic device according to the present disclosure is not limited to the foregoing devices.

Hereinafter, an electronic device according to various exemplary embodiments of the present disclosure will be described with reference to the accompanying drawings. The term "user" as used in the description herein may indicate a person using an electronic device or a device (e.g., artificial intelligence electronic device) using the electronic device.

FIG. 7 is a block diagram illustrating a configuration of a network environment 100 including an electronic device 101 according to various exemplary embodiments of the present disclosure. Electronic device 101 may be any of the devices discussed in connection with FIG. 6, and includes a semiconductor device 100 (which hereafter refers to any of devices 100, 100', 100", etc. described above).

As shown in FIG. 7, the electronic device 101 may include a bus 110, processor 120, memory 130, input and output (I/O) interface 140, display 150, communication interface 160, and function module 170. The bus 110 may be a circuit that connects the foregoing constituent elements and that performs communication (e.g., transmit a control message) between the foregoing constituent elements. In an embodiment, at least one of the elements 110 to 170 are part of semiconductor device 100. In an embodiment, processor 120 and memory 130 are part of semiconductor device 100. For example, memory 130 may be formed by the one or more memories 3, 10a, 10b, etc., and processor 120 may be formed by the one or more processors 1, 10c, etc. described above. In another embodiment, semiconductor device 100 includes at least one additional element 110, 140, 150, 160 and 170, or a portion thereof.

The processor 120 may receive an instruction from the foregoing other constituent elements (e.g., the memory 130, I/O interface 140, display 150, communication interface 160, or function module 170) through, for example, the bus 110, decode the received instruction, and perform operation and data processing according to the decoded instruction. Bus 110 may be formed at least in part by any of the memory bridges 30, 30a, etc. described earlier.

The memory 130 may store an instruction or data received from the processor 120 or other constituent elements (e.g., the I/O interface 140, display 150, communication interface 160, or function module 170) or generated by the processor 120 or other constituent elements. The memory 130 may include a programming module such as a kernel 131, middleware 132, an Application Programming Interface (API) 133, or an application 134. The foregoing respective programming modules may be formed with software, firmware, hardware, or a combination of at least two thereof.

The kernel 131 may control or manage a system resource (e.g., the bus 110, processor 120, or memory 130) used for executing an operation or a function implemented in the remaining programming modules, for example, the middleware 132, API 133, or application 134. Further, the kernel 131 may provide an interface that can provide access to an individual constituent element of the electronic device 101 in the middleware 132, the API 133, or the application 134 to control or manage the individual constituent element.

The middleware 132 may perform an intermediary function of enabling the API 133 or the application 134 to communicate with the kernel 131 to give and receive data. Further, the middleware 132 may control (e.g., schedule or load balance) a work request received from the application 134 using, for example, a method of aligning a priority that can use a system resource (e.g., the bus 110, processor 120, or memory 130) of the electronic device 101 to at least one of the applications 134.

The API 133 is an interface that enables the application 134 to control a function in which the kernel 131 or the middleware 132 provides and may include, for example, at least one interface or function (e.g., instruction) for file control, window control, image processing, or text control.

According to various exemplary embodiments, the application 134 may include an SMS/MMS application, e-mail application, calendar application, alarm application, health care application (e.g., application that measures an exercise amount or blood sugar), or environment information application (e.g., application that provides atmospheric pressure, humidity, or temperature information). Additionally or alternatively, the application 134 may be an application related to information exchange between the electronic device 101 and an external electronic device (e.g., an electronic device 102 or an electronic device 104). The application related to information exchange may include, for example, a notification relay application that transmits specific information to the external electronic device or a device management application that manages the external electronic device.

For example, the notification relay application may include a function of transmitting notification information that has occurred in other applications (e.g., an SMS/MMS application, e-mail application, health care application, or environment information application) of the electronic device 101 to an external electronic device (e.g., the electronic device 102 or the electronic device 104). Additionally or alternatively, for example, the notification relay application may receive notification information from an external electronic device (e.g., the electronic device 102 or the electronic device 104) and provide the notification information to a user. For example, the device management application may manage (e.g., install, delete, or update) turn-on/turn-off of a function (e.g., an external electronic device (or a partial component)) of at least a portion of an external electronic device (e.g., the electronic device 102 or the electronic device 104) that communicates with the electronic device 101 or brightness of a display (or resolution adjustment), an application operating in an external electronic device, or a service (e.g., a communication service or a message service) provided in an external electronic device.

According to various exemplary embodiments, the application 134 may include an application designated according to an attribute (e.g., a type) of an external electronic device (e.g., the electronic device 102 or the electronic device 104). For example, when the external electronic device is an MP3 player, the application 134 may include an application related to music reproduction. Similarly, when the external electronic device is a mobile medical device, the application 134 may include an application related to health care. According to an exemplary embodiment, the application 134 may include at least one of an application originally designated for the electronic device 101 or an application received from an external electronic device (e.g., a server 164, the electronic device 102, or the electronic device 104).

The I/O interface 140 may transfer an instruction or data input by a user through an I/O device (e.g., a sensor, keyboard, or touch screen) to the processor 120, memory 130, communication interface 160, or function module 170 through, for example, the bus 110. For example, the input and output interface 140 may provide data about a user touch input through a touch screen to the processor 120. Further, I/O interface 140 may output an instruction or data received from the processor 120, memory 130, communication interface 160, or function module 170 through, for example, the bus 110, through the I/O device (e.g., a speaker or a display). For example, I/O interface 140 may output sound data processed through the processor 120 to the user through a speaker.

The display 150 may display various information (e.g., multimedia data or text data) to the user.

The communication interface 160 may connect communication between the electronic device 101 and an external device (e.g., the electronic device 102, electronic device 104, or server 164). For example, the communication interface 160 may support communication of a network 162 (e.g., Internet, LAN, WAN, telecommunication network, cellular network, satellite network, or POTS), short range communication 164 (e.g., WiFi, BT, or NFC), or wire communication (e.g., USB, HDMI, RS-232, or POTS). According to an exemplary embodiment, a protocol for communication between the electronic device 101 and an external device (e.g., a short range communication protocol, network communication protocol, or wire communication protocol) may be supported in at least one of the API 133 or the middleware 132. The electronic devices 102 and 104 each may be the same type of device (e.g. the same design) as the electronic device 101, or may be different (e.g., different type) from the electronic device 101.

Figure 8:
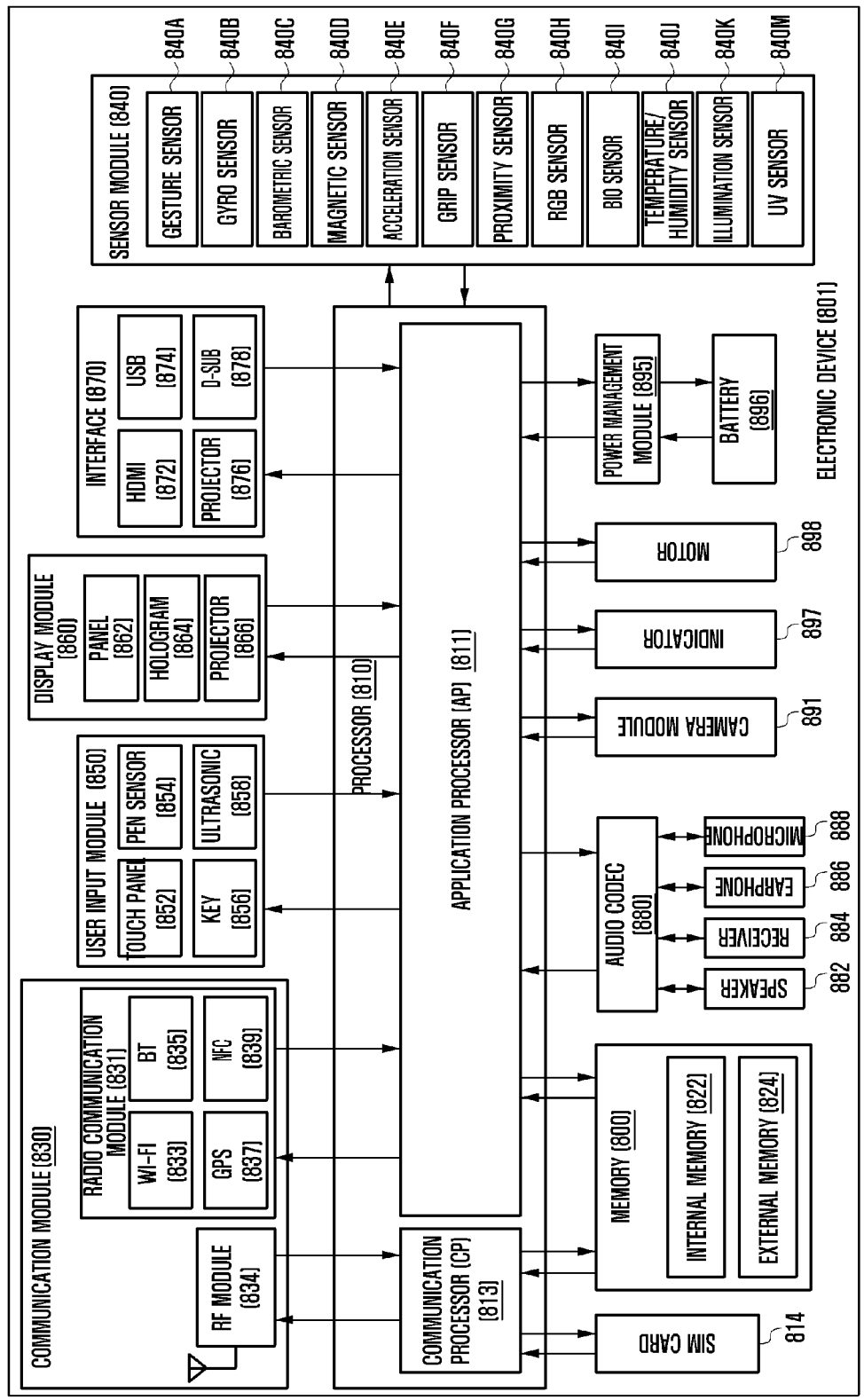
FIG. 8 is a block diagram illustrating a configuration of an electronic device according to an exemplary embodiment of the present disclosure.

FIG. 8 is a block diagram illustrating a configuration of an electronic device 801 according to various exemplary embodiments of the present disclosure. The electronic device 801 may form, for example, the entire or a portion of the electronic device 101 of FIG. 7, including semiconductor device 100.

As shown in FIG. 8, the electronic device 801 may include at least one processor, a Subscriber Identification Module (SIM) card 814, a memory 820, a communication module 830, a sensor module 840, a user input module 850, a display module 860, an interface 870, an audio module 880, a camera module 891, a power management module 895, a battery 896, an indicator 897, or a motor 898. Some of these elements may be included partially or entirely within the semiconductor device 100 or 100", etc., (which may also referred to as a processor module) which forms part of the electronic device 801.

The processor 810 (e.g., the processor 120) may include at least one Application Processor (AP) 811 or at least one Communication Processor (CP) 813. In FIG. 8, the AP 811 and the CP 813 may be included within the processor 810, but the AP 811 and the CP 813 may be included within different IC packages, respectively. In an exemplary embodiment, the AP 811 and the CP 813 may be included within an integrated circuit (IC) package.

The AP 811 may drive an operation system or an application program to control a plurality of hardware or software components connected to the AP 811 and perform various data processing and operations including multimedia data. The AP 811 may be implemented with, for example, a System on Chip (SoC). According to an exemplary embodiment, the processor 810 may further include a Graphic Processing Unit (GPU) (not shown).

The CP 813 may perform a function of managing a data link in communication between the electronic device 801 and other electronic devices (e.g., electronic device 102, electronic device 104, or server 164 of FIG. 7) connected by a network and a function of converting a communication protocol. The CP 813 may be implemented with, for example, an SoC. According to an exemplary embodiment, the CP 813 may perform at least a portion of a multimedia control function. The CP 813 may perform identification and authentication of the electronic device within a communication network using, for example, a subscriber identification module (e.g., a SIM card 814). Further, the CP 813 may provide services such as audio dedicated communication, audiovisual communication, a text message, or packet data to the user.

Further, the CP 813 may control data transmission and reception of the communication module 830. In FIG. 8, elements of the CP 813, the power management module 895, or the memory 820 are elements separate from the AP 811, but according to an exemplary embodiment, the AP 811 may include at least a portion (e.g., the CP 813) of the foregoing elements.

According to an exemplary embodiment, the AP 811 or the CP 813 may load and process an instruction or data received from at least one of other elements or a non-volatile memory connected to each of the AP 811 and the CP 813 in a volatile memory. Further, the AP 811 or the CP 813 may store data received from at least one of other elements or generated by at least one of other elements at a non-volatile memory.

The SIM card 814 may be a card including a subscriber identification module and may be inserted into a slot formed at a specific location of the electronic device. The SIM card 814 may include intrinsic identification information (e.g., Integrated Circuit Card Identifier (ICCID)) or subscriber information (e.g., International Mobile Subscriber Identity (IMSI)).

The memory 820 (e.g., the memory 130) may include an internal memory 822 or an external memory 824. The internal memory 822 may include at least one of, for example, a volatile memory (e.g., a Dynamic RAM (DRAM), Static RAM (SRAM), Synchronous Dynamic RAM (SDRAM)), or a non-volatile memory (e.g., a One Time Programmable ROM (OTPROM), Programmable ROM (PROM), Erasable and Programmable ROM (EPROM), Electrically Erasable and Programmable ROM (EEPROM), mask ROM, flash ROM, NAND flash memory, and NOR flash memory). According to an exemplary embodiment, the internal memory 822 may be a Solid State Drive (SSD). The external memory 824 may further include a flash drive, for example, a Compact Flash (CF), Secure Digital (SD), Micro Secure Digital (Micro-SD), Mini Secure Digital (Mini-SD), extreme Digital (xD), or memory stick. The external memory 824 may be functionally connected to the electronic device 801 through various interfaces. According to an exemplary embodiment, the electronic device 801 may further include a storage device (or storage medium) such as a hard drive.

The communication module 830 (e.g., the communication interface 160) may include a wireless communication module 831 or a Radio Frequency (RF) module 834. The wireless communication module 831 may include, for example, a WiFi module 833, Bluetooth (BT) module 835, GPS module 837, or NFC module 839. For example, the wireless communication module 831 may provide a wireless communication function using a radio frequency. Additionally or alternatively, the wireless communication module 831 may include a network interface (e.g., a LAN card) or a modem that connects the electronic device 801 to a network (e.g., Internet, a LAN, a WAN, a telecommunication network, a cellular network, a satellite network, or a POTS.

The RF module 834 may perform transmission and reception of data, for example, transmission and reception of an RF signal. Although not shown, the RF module 834 may include, for example, a transceiver, Power Amp Module (PAM), frequency filter, or Low Noise Amplifier (LNA). Further, the RF module 834 may further include a component, for example, a conductor or a conductive wire that transmits and receives electromagnetic waves on free space in wireless communication.

The sensor module 840 may measure a physical quantity or detect an operation state of the electronic device 801 and convert measured or detected information to an electric signal. The sensor module 840 may include at least one of, for example, a gesture sensor 840A, gyro sensor 840B, atmospheric pressure sensor 840C, magnetic sensor 840D, acceleration sensor 840E, grip sensor 840F, proximity sensor 840G, color sensor 840H (e.g., Red, Green, and Blue (RGB) sensor), bio sensor 840I, temperature/humidity sensor 840J, illumination sensor 840K, or Ultra Violet (UV) sensor 840M. Additionally or alternatively, the sensor module 840 may include, for example, an E-nose sensor (not shown), electromyography sensor (EMG sensor) (not shown), electroencephalogram sensor (EEG sensor) (not shown), electrocardiogram sensor (ECG sensor) (not shown), Infrared (IR) sensor (not shown), iris sensor (not shown), or fingerprint sensor (not shown). The sensor module 840 may further include a control circuit that controls at least one sensor belonging to the inside thereof.

The user input module 850 may include a touch panel 852, (digital) pen sensor 854, key 856, or ultrasonic wave input device 858. The touch panel 852 may recognize a touch input with at least one method of, for example, a capacitive, resistive, infrared ray, or ultrasonic wave method. Further, the touch panel 852 may further include a control circuit. When the touch panel 852 is a capacitive type touch panel, the touch panel 852 may perform a physical contact or proximity recognition. The touch panel 852 may further include a tactile layer. In this case, the touch panel 852 may provide a haptic reaction to the user.

The (digital) pen sensor 854 may be implemented using the same method as and a method similar to, for example, reception of a touch input of the user or a separate recognition sheet. The key 856 may include, for example, a physical button, optical key, keypad, or touch key. The ultrasonic wave input device 858 may determine data by detecting a sound wave with a microphone (e.g., a microphone 888) in the electronic device through an input means that generates an ultrasonic wave signal and may perform wireless recognition. According to an exemplary embodiment, the electronic device 801 may receive a user input from an external device (e.g., a network, computer, or server) connected to the communication module 830 using the communication module 830.

The display module 860 (e.g., the display 150) may include a panel 862, hologram 864, or projector 866. The panel 862 may be, for example, a Liquid Crystal Display (LCD) or an Active-Matrix Organic Light-Emitting Diode (AM-OLED). The panel 862 may be implemented with, for example, a flexible, transparent, or wearable method. The panel 862 and the touch panel 852 may be formed in a module. The hologram 864 may show a stereoscopic image in the air using interference of light. The projector 866 may project light on a screen to display an image. The screen may be located, for example, at the inside or the outside of the electronic device 801. According to an exemplary embodiment, the display module 860 may further include a control circuit that controls the panel 862, hologram 864, or projector 866.

The interface 870 may include, for example, a High-Definition Multimedia Interface (HDMI) 872, Universal Serial Bus (USB) 874, optical communication terminal 876, or D-Subminiature (D-SUB) 878. The interface 870 may be included in, for example, the communication interface 160 of FIG. 7. Additionally or alternatively, the interface 870 may include, for example, a Mobile High-definition Link (MHL) (not shown), a Secure Digital (SD)/Multi-Media Card (MMC) (not shown), or Infrared Data Association (IrDA) (not shown).

The audio module 880 may interactively convert a sound and an electronic signal. At least a partial constituent element of the audio module 880 may be included, for example, in the input and output interface 140 of FIG. 7. The audio module 880 may process sound information input or output through, for example, a speaker 882, receiver 884, earphone 886, or microphone 888.

The camera module 891 may photograph a still picture and a moving picture and include at least one image sensor (e.g., a front surface lens or a rear surface lens), a lens (not shown), an Image Signal Processor (ISP) (not shown), or a flash (not shown) (e.g., a Light Emitting diode (LED) or a xenon lamp) according to an exemplary embodiment.

The power management module 895 may manage power of the electronic device 801. Although not shown, the power management module 895 may include, for example, a Power Management Integrated Circuit (PMIC), a charger Integrated Circuit (charge IC), a battery or a fuel gauge.

The PMIC may be mounted within, for example, an IC or an SoC semiconductor. A charging method may be classified into a wired method and a wireless method. The charge IC may charge a battery and prevent an overvoltage or an overcurrent from being injected from a charger. According to an exemplary embodiment, the charge IC may include a charge IC for at least one of a wired charge method and a wireless charge method. The wireless charge method may include, for example, a magnetic resonance method, magnetic induction method, or electromagnetic wave method and may add an additional circuit, for example, a circuit such as a coil loop, resonant circuit, and rectifier for wireless charge.

The battery gauge may measure, for example, a residual quantity of the battery 896, a voltage, current, or temperature while charging. The battery 896 may store or generate electricity and supply power to the electronic device 801 using the stored or generated electricity. The battery 896 may include, for example, a rechargeable battery or a solar battery.

The indicator 897 may display a specific state, for example, a booting state, a message state, or a charge state of the electronic device 801 or a portion (e.g., the AP 811) thereof. The motor 898 may convert an electrical signal to a mechanical vibration. Although not shown, the electronic device 801 may include a processing device (e.g., GPU) that supports a mobile television. The processing device that supports the mobile television may process media data according to a specification of, for example, Digital Multimedia Broadcasting (DMB), Digital Video Broadcasting (DVB), or media flow.

The foregoing constituent elements of an electronic device according to the present disclosure may each be formed with at least one component, and a name of a corresponding constituent element may be changed according to a type of the electronic device. The electronic device according to the present disclosure may include at least one of the foregoing elements and may omit some elements or may further include additional other elements. Further, as some of the elements of an electronic device according to the present disclosure are coupled to form an entity, the entity may equally perform a function of corresponding elements before coupling.

Figure 9:
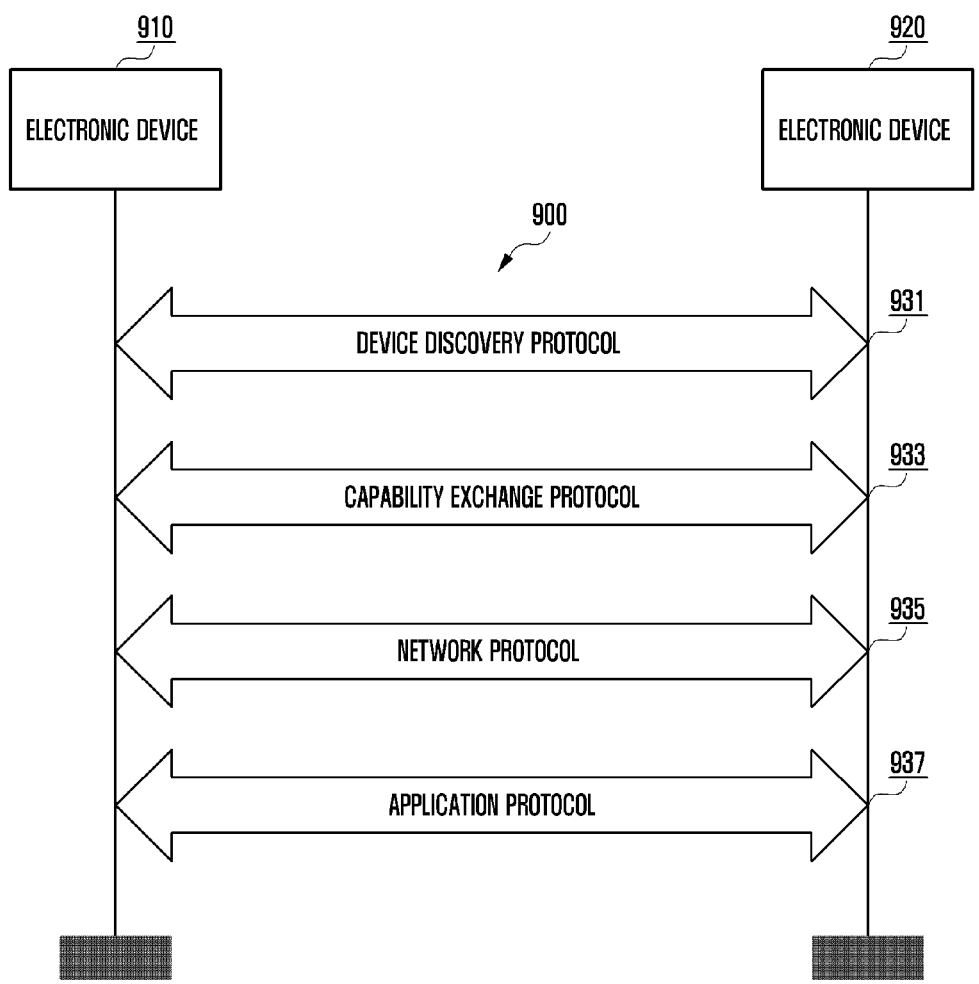
FIG. 9 is a message flow diagram illustrating a communication protocol between electronic devices according to an exemplary embodiment of the present disclosure.

FIG. 9 is a message flow diagram illustrating a communication protocol 900 between a plurality of electronic devices (e.g., an electronic device 910 and an electronic device 920) according to various exemplary embodiments of the present disclosure. The communication protocol 900 may include, for example, a device discovery protocol 931, capability exchange protocol 933, network protocol 935, and application protocol 937.

According to an exemplary embodiment, the device discovery protocol 931 may be a protocol that detects an external electronic device that can communicate with electronic devices (e.g., the electronic device 910 or the electronic device 920) or a protocol that connects to the detected external electronic device. For example, the electronic device 910 (e.g., the electronic device 101) may communicate with the electronic device 910 through a communication method (e.g., WiFi, BT, or USB) that can be used in the electronic device 910 using the device discovery protocol 931 and may detect the electronic device 920 (e.g., the electronic device 102). The electronic device 910 may acquire and store identification information of the detected electronic device 920 using the device discovery protocol 931 for communication connection to the electronic device 920. The electronic device 910 may start communication connection to the electronic device 920 based on, for example, at least the identification information.

According to an exemplary embodiment, the device discovery protocol 931 may be a protocol for mutual authentication between a plurality of electronic devices. For example, the electronic device 910 may perform authentication between the electronic device 910 and the electronic device 920 based on communication information (e.g., a Media Access Control (MAC) address, Universally Unique Identifier (UUID), Subsystem Identification (SSID), Information Provider (IP) address) for connection to at least the electronic device 920.

According to an exemplary embodiment, the capability exchange protocol 933 may be a protocol that exchanges information related to a function of a service in which at least one of the electronic device 910 or the electronic device 920 can support. For example, the electronic device 910 and the electronic device 920 may exchange information related to a function of a service in which each thereof presently provides through the capability exchange protocol 933. Information that can be exchanged may include identification information indicating a specific service of a plurality of services in which the electronic device 910 and the electronic device 920 can support. For example, the electronic device 910 may receive identification information of a specific service in which the electronic device 920 provides through the capability exchange protocol 933. In this case, the first electronic device 910 may determine whether the electronic device 910 can support the specific service based on the received identification information.

According to an exemplary embodiment, the network protocol 935 may be a protocol for controlling data flow transmitted and received so as to provide an interlocked or paired data service between electronic devices (e.g., the electronic device 910 and the electronic device 920) connected to perform communication. For example, at least one of the electronic device 910 or the electronic device 920 may perform an error control or a data quality control using the network protocol 935. Additionally or alternatively, the network protocol 935 may determine a transmitting format of data transmitted or received between the electronic device 910 and the electronic device 920. Further, at least one of the electronic device 910 and the electronic device 920 may manage (e.g., session connection or session termination) at least a session for mutual data exchange using the network protocol 935.

According to an exemplary embodiment, the application protocol 937 may be a protocol that provides a procedure or information to exchange data related to a service provided to an external electronic device. For example, the electronic device 910 (e.g., the electronic device 101) may provide a service to the electronic device 920 (e.g., the electronic device 102, the electronic device 104, or the server 164) through the application protocol 937.

According to an exemplary embodiment, the communication protocol 900 may include a standard communication protocol, a communication protocol (e.g., a communication protocol designated by a communication device production company or a network provider) designated by an individual or a group, or a combination thereof.

The term "module" used in the present disclosure may be a unit including a combination of at least one of, for example, hardware, software, or firmware. The "module" may be interchangeably used with a term such as a unit, logic, a logical block, a component, or a circuit. The "module" may be a minimum unit or a portion of an integrally formed component. The "module" may be a minimum unit or a portion that performs at least one function. The "module" may be mechanically or electronically implemented. For example, a "module" according to an exemplary embodiment of the present disclosure may include at least one of an Application-Specific Integrated Circuit (ASIC) chip, Field-Programmable Gate Arrays (FPGAs), or a programmable-logic device that performs any operation known or to be developed.

According to various exemplary embodiments, at least a portion of a method (e.g., operations) or a device (e.g., modules or functions thereof) according to the present disclosure may be implemented with an instruction stored at computer-readable storage media in a form of, for example, a programming module. When the instruction is executed by at least one processor (e.g., the processor 120), the at least one processor may perform a function corresponding to the instruction. The computer-readable storage media may be, for example, the memory 130. At least a portion of the programming module may be implemented (e.g., executed) by, for example, the processor 120. At least a portion of the programming module may include, for example, a module, a program, a routine, sets of instructions, or a process that performs at least one function.

The computer-readable storage media may include magnetic media such as a hard disk, floppy disk, and magnetic tape, optical media such as a Compact Disc Read Only memory (CD-ROM) and a Digital Versatile Disc (DVD), magneto-optical media such as a floptical disk, and a hardware device, specially formed to store and perform a program instruction (e.g., a programming module), such as a Read Only memory (ROM), a Random Access memory (RAM), a flash memory. Further, a program instruction may include a high-level language code that may be executed by a computer using an interpreter as well as a machine language code generated by a compiler. In order to perform operation of devices, systems and methods of the present disclosure, the above-described hardware device may be formed to operate as at least one software module, and vice versa.

A module or a programming module according to the present disclosure may include at least one of the foregoing constituent elements, may omit some constituent elements, or may further include additional other constituent elements. Operations performed by a module, a programming module, or another constituent element according to the present disclosure may be executed with a sequential, parallel, repeated, or heuristic method. Further, some operations may be executed in different orders, may be omitted, or may add other operations.

According to various exemplary embodiments, in a storage medium that stores instructions, when the instructions are executed by at least one processor, the instructions are set to enable the at least one processor to perform at least one operation, wherein the at least one operation may include operation of acquiring, by a first electronic device, address information of a second electronic device and location information of at least one application to be executed by interlocking (e.g. pairing) with at least the second electronic device through first short range communication with the outside; operation of connecting, by the first electronic device, second distance communication with the second electronic device based on the address information; operation of receiving, by the first electronic device, the application from the outside based on the location information; and operation of executing, by the first electronic device, the application by interlocking with the second electronic device through the second distance communication.

A semiconductor device according to an exemplary embodiment of the present disclosure may include at least one dummy chip including at least one TSV; at least one universal memory bridge including at least one TSV; at least one memory connected to the at least one dummy chip and the at least one universal memory bridge and that can exchange an electric signal through the at least one dummy chip and the at least one universal memory bridge; and at least one processor that can exchange an electric signal through the at least one universal memory bridge.

A semiconductor device according to an exemplary embodiment of the present disclosure may further include at least one conductive bump that can exchange an electric signal by disposing the at least one dummy chip, the at least one universal memory bridge, the at least one memory, and the at least one processor at one surface.

A semiconductor device according to an exemplary embodiment of the present disclosure may further include a board connected to the at least one dummy chip, the at least one universal memory bridge, the at least one memory, and the at least one processor.

The at least one universal memory bridge according to an exemplary embodiment of the present disclosure may include an input and output interface that can interconvert the at least one memory and the at least one processor having different input and output interfaces.

The at least one universal memory bridge according to an exemplary embodiment of the present disclosure may include an input and output interface that can interconvert an external memory device and the at least one processor.

The at least one universal memory bridge according to an exemplary embodiment of the present disclosure may be a controller including a function of controlling the at least one memory.

The at least one memory according to an exemplary embodiment of the present disclosure may be a non-volatile memory or a volatile memory.

The at least one processor according to an exemplary embodiment of the present disclosure may be an application processor.

A separate power source may be connected to each of the at least one memory according to an exemplary embodiment of the present disclosure. In the at least one memory according to an exemplary embodiment of the present disclosure, a circuit surface may face in a chip direction stacked in a lowermost layer. In the at least one memory according to an exemplary embodiment of the present disclosure, a power source line that connects a power source may be connected in a direction in which a circuit surface does not face.

In a semiconductor device according to an exemplary embodiment of the present disclosure, the at least one universal memory bridge may be disposed at both sides of the right side and the left side about the processor on the board, at least one dummy chip may be disposed at both sides of the right side and the left side about the at least one memory on the processor and the at least one memory bridge, and the at least one memory may be disposed at both sides of the right side and the left side on the at least one memory and the at least one dummy chip.

In a semiconductor device according to an exemplary embodiment of the present disclosure, the at least one processor may be disposed at both sides of the right side and the left side about a universal memory bridge on the board, the at least one memory may be disposed about a dummy chip on the at least one processor and the universal memory bridge, and the at least one memory may be disposed on the at least one memory and the dummy chip.

A semiconductor device of the foregoing various exemplary embodiments is included in an electronic device to operate as a portion of the electronic device. For example, the semiconductor device may perform (or form) at least a portion of a method of operating or a configuration of the electronic device described with reference to at least one of FIGS. 7 to 9. For example, a semiconductor device of various exemplary embodiments may include at least a portion of the processor 120 of FIG. 7 or the AP 811 of FIG. 8. In this way, a semiconductor device included as a portion of the electronic device may perform at least a portion of operation of the electronic device described with reference to FIGS. 7 to 9.

As described above, in an electronic device including a semiconductor device according to the present disclosure, by using a universal memory bridge chip including a TSV, the electronic device can use a high speed interface at a low cost, a semiconductor chip design area increases, and thus a process cost can be reduced.

Although exemplary embodiments of the present disclosure have been described in detail hereinabove, it should be clearly understood that many variations and modifications of the basic inventive concepts herein described, which may appear to those skilled in the art, will still fall within the spirit and scope of the exemplary embodiments of the present disclosure as defined in the appended claims.

What is claimed is:

1. An electronic device, comprising:
a communication module;
an input module;
a display;
an interface;
at least one sensor;
a first memory; and
a processor module,
wherein the processor module comprises at least one of:
at least one dummy chip comprising at least one Through Silicon Via (TSV);
at least one memory bridge comprising at least one TSV;
at least one second memory, connected to the at least one dummy chip and the at least one memory bridge, and configured to exchange an electric signal through the at least one dummy chip and the at least one memory bridge; and
at least one processor configured to exchange an electric signal with the at least one second memory through the at least one memory bridge, and configured to transmit an electric signal to at least one of the communication module, the input module, the display, the interface, and the at least one sensor, or first memory,
wherein the at least one memory bridge comprises an input and output (I/O) interface configured to interconvert a memory and the at least one processor having different input and output interfaces.

2. The electronic device of claim 1, further comprising a plurality of conductive bumps each disposed at a surface of at least one of the at least one dummy chip, the at least one memory bridge, the at least one memory, and the at least one processor, each conductive bump each being part of a circuit path for exchanging a signal.

3. The electronic device of claim 2, further comprising a board connected to the at least one dummy chip, the at least one memory bridge, the at least one memory, and the at least one processor.

4. The electronic device of claim 3, wherein the at least one memory bridge comprises an input and output (I/O) interface configured to interconvert the at least one second memory and the at least one processor having different input and output interfaces.

5. The electronic device of claim 4, wherein the at least one memory bridge comprises an input and output (I/O) interface that can interconvert an external memory device comprising the first memory and the at least one second memory.

6. The electronic device of claim 4, wherein the at least one memory bridge comprises a controller comprising a function of controlling the at least one second memory.

7. The electronic device of claim 6, wherein the at least one second memory is a non-volatile memory or a volatile memory.

8. The electronic device of claim 7, wherein the at least one processor is an application processor.

9. The electronic device of claim 3, wherein a separate power source is connected to each individual memory of the at least one second memory.

10. The electronic device of claim 9, wherein in the at least one second memory, a circuit surface faces towards a lowermost layer of a vertical stack of chips.

11. The electronic device of claim 10, wherein in the at least one second memory, a power source line that connects to a power source is electrically connected to a bump on a surface thereof.

12. The electronic device of claim 3, wherein the at least one second memory comprises, first through fourth internal memories, the at least one memory bridge comprises first and second memory bridges disposed at respective sides of a right side and a left side about the processor on the board, the at least one dummy chip comprises first and second dummy chips disposed at both sides of the right side and the left side about the at second and fourth internal memories on the processor and the at least one memory bridge, and the first and third internal memories are disposed at the respective left and right sides on the second and fourth memories and the at least one dummy chip.

13. The electronic device of claim 3, wherein the at least one processor comprises a first processor and a second processor respectively disposed at a right side and a left side about a memory bridge on the board, the at least one second memory has a first portion disposed about a dummy chip on the at least one processor and the memory bridge, and the at least one second memory has another portion disposed on the first portion of the at least one memory and the dummy chip.

14. An electronic device, comprising:
a bus;
a processor module electrically connected to the bus;
a first memory electrically connected to the bus;
an input and output (I/O) interface electrically connected to the bus;
a display electrically connected to the bus; and
a communication interface electrically connected to the bus,
wherein the electronic device communicates with an external network using the communication interface, and
wherein the processor module comprises at least one of:
at least one dummy chip comprising at least one Through Silicon Via (TSV);
at least one memory bridge comprising at least one TSV;
at least one second memory connected to the at least one dummy chip and the at least one memory bridge and configured to exchange an electric signal through the at least one dummy chip and the at least one memory bridge; and
at least one processor configured to exchange an electric signal through the at least one memory bridge, wherein the at least one processor transmits an electric signal to at least one of the first memory, the I/O interface, the display, or the communication interface,
wherein the at least one memory bridge comprises an input and output (I/O) interface configured to interconvert a memory and the at least one processor having different input and output interfaces.

15. The electronic device of claim 14, wherein the electric signal transmitted by the at least one processor comprises information retrieved from the at least one second memory through the electric signal exchanged with the at least one of the dummy chip and the memory bridge.

16. The electronic device of claim 14, wherein the at least one processor performs communication with another electronic device using a device discovery protocol and the communication interface.

17. The electronic device of claim 14, wherein the electronic device further comprises a hologram device,
wherein the at least one processor controls to display an image stored at the first memory or the at least one second memory using the hologram device.

18. A method of operating an electronic device, the electronic device comprising: a bus; a processor module electrically connected to the bus; a first memory electrically connected to the bus; an input and output (I/O) interface electrically connected to the bus; a display electrically connected to the bus; and a communication interface electrically connected to the bus, wherein the electronic device communicates with an external network using the communication interface, and wherein the processor module comprises at least one of: at least one dummy chip comprising at least one Through Silicon Via (TSV); at least one memory bridge comprising at least one TSV; at least one second memory connected to the at least one dummy chip and the at least one memory bridge and configured to exchange an electric signal through at least one dummy chip and the at least one memory bridge; and at least one processor configured to exchange an electric signal through the at least one memory bridge, the method comprising:

transmitting, by the at least one processor, an electric signal to at least one of the first memory, the I/O interface, the display, or the communication interface; and communicating, by the at least one processor, with an external network using the communication interface of the electronic device, wherein communicating with an external network using the communication interface of the electronic device comprises retrieving information from or providing information to the at least one second memory through the at least one of the dummy chip, the memory bridge, or a portion of the at least one second memory, wherein the at least one memory bridge comprises an input and output (I/O) interface configured to interconvert a memory and the at least one processor having different input and output interfaces.

19. The method of claim 18, wherein communicating with an external network using the communication interface of the electronic device further comprises using a device discovery protocol with another electronic device using the communication interface.

20. The method of claim 18, wherein communicating with an external network using the communication interface of the electronic device further comprises using a network protocol with another electronic device using the communication interface.

21. An electronic device, comprising:
a board;
a processor;
a first memory; and
a second memory,
wherein the processor is disposed between the board and the second memory, exchanges an electric signal with the board or the second memory through a first conductive bump, and receives power or an electric signal from the board through a first power source line connected to the board, and
the second memory is disposed between the processor and the first memory, exchanges an electric signal with the processor or the first memory through the first or a second conductive bump, and receives power or an electric signal from the board through a second power source line connected to the board,
wherein the at least one memory bridge comprises an input and output (I/O) interface configured to interconvert a memory and the at least one processor having different input and output interfaces.

* * * * *